(12) United States Patent
Masunaga et al.

(10) Patent No.: US 8,361,693 B2
(45) Date of Patent: Jan. 29, 2013

(54) CHEMICALLY AMPLIFIED POSITIVE PHOTORESIST COMPOSITION AND PATTERN FORMING PROCESS

(75) Inventors: Keiichi Masunaga, Joetsu (JP); Akinobu Tanaka, Joetsu (JP); Daisuke Domon, Joetsu (JP); Satoshi Watanabe, Joetsu (JP); Youichi Ohsawa, Joetsu (JP); Masaki Ohashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 283 days.

(21) Appl. No.: 12/815,787

(22) Filed: Jun. 15, 2010

(65) Prior Publication Data

US 2010/0316955 A1    Dec. 16, 2010

(30) Foreign Application Priority Data

Jun. 16, 2009  (JP) ................................ 2009-142909

(51) Int. Cl.
*G03F 7/00* (2006.01)
*G03F 7/004* (2006.01)
*G03F 7/028* (2006.01)

(52) U.S. Cl. ...................... 430/270.1; 430/913; 430/945
(58) Field of Classification Search ............... 430/270.1, 430/913, 945
See application file for complete search history.

(56) References Cited

U.S. PATENT DOCUMENTS

| | | | | |
|---|---|---|---|---|
| 5,945,250 A * | 8/1999 | Aoai et al. | ............... | 430/270.1 |
| 7,157,208 B2 * | 1/2007 | Sasaki et al. | ............... | 430/270.1 |
| 7,416,832 B2 * | 8/2008 | Kawana et al. | ............. | 430/270.1 |
| 7,541,131 B2 * | 6/2009 | Kawanishi | ................. | 430/270.1 |
| 7,569,326 B2 * | 8/2009 | Ohsawa et al. | ............. | 430/270.1 |
| 7,851,130 B2 * | 12/2010 | Kawanishi et al. | ........ | 430/270.1 |
| 8,048,610 B2 * | 11/2011 | Ohsawa et al. | ............. | 430/270.1 |
| 8,057,985 B2 * | 11/2011 | Ohashi et al. | .............. | 430/270.1 |
| 8,105,748 B2 * | 1/2012 | Ohashi et al. | .............. | 430/270.1 |
| 8,110,333 B2 * | 2/2012 | Kamimura et al. | ........ | 430/270.1 |
| 8,110,335 B2 * | 2/2012 | Takeda et al. | .............. | 430/270.1 |
| 8,129,886 B2 * | 3/2012 | Zhao et al. | .................... | 310/334 |
| 2004/0260031 A1 | 12/2004 | Takeda et al. | | |
| 2007/0149702 A1 | 6/2007 | Ando et al. | | |
| 2008/0090179 A1 * | 4/2008 | Takeda et al. | .............. | 430/286.1 |
| 2008/0096128 A1 | 4/2008 | Takeda et al. | | |
| 2008/0274422 A1 * | 11/2008 | Masunaga et al. | ......... | 430/270.1 |
| 2008/0305411 A1 | 12/2008 | Koitabashi et al. | | |
| 2009/0042124 A1 * | 2/2009 | Kamimura et al. | ........ | 430/270.1 |

FOREIGN PATENT DOCUMENTS

| | | |
|---|---|---|
| JP | 9-325497 A | 12/1997 |
| JP | 2004-115630 A | 4/2004 |
| JP | 2005-8766 A | 1/2005 |
| JP | 2006-215271 A | 8/2006 |
| JP | 2007-197718 A | 8/2007 |
| JP | 2008095009 A * | 4/2008 |
| JP | 2008-102383 A | 5/2008 |
| JP | 2008-133448 A | 6/2008 |
| JP | 2008-304590 A | 12/2008 |

OTHER PUBLICATIONS

Machine translation of JP 9-325497 (no date).*
Machine translation of JP 2007-197718 9no date).*
EPO Extended European Search Report, Appl. No. 10251092.2, Oct. 5, 2011; pp. 1-5.
Wang, M. et al, "Novel Anionic Photoacid Generator (PAGs) and Photoresist for sub-50 nm Patterning by EUVL and EBL," Proceedings of SPIE, Jan. 1, 2011, vol. 6519, pp. 65191F-1 to 6519F-6.

* cited by examiner

*Primary Examiner* — Amanda C. Walke
(74) *Attorney, Agent, or Firm* — Birch, Stewart, Kolasch & Birch, LLP

(57) ABSTRACT

A polymer comprising a high proportion of aromatic ring structure-containing units and containing an aromatic sulfonic acid sulfonium salt on a side chain is used to form a chemically amplified positive photoresist composition which is effective in forming a resist pattern having high etch resistance. The polymer overcomes the problems of dissolution in solvents for polymerization and purification and in resist solvents.

10 Claims, No Drawings

CHEMICALLY AMPLIFIED POSITIVE PHOTORESIST COMPOSITION AND PATTERN FORMING PROCESS

CROSS-REFERENCE TO RELATED APPLICATION

This non-provisional application claims priority under 35 U.S.C. §119(a) on Patent Application No. 2009-142909 filed in Japan on Jun. 16, 2009, the entire contents of which are hereby incorporated by reference.

TECHNICAL FIELD

This invention generally relates to a chemically amplified positive photoresist composition and a resist pattern forming process. The chemically amplified positive photoresist composition is sensitive to high-energy radiation such as UV, deep-UV, EUV, X-ray, γ-ray, synchrotron radiation, and electron beam (EB), and especially suited for use in the exposure step of irradiating high-energy radiation beam, typically EB or deep-UV, and adapted for microfabrication of semiconductor devices and photomasks.

BACKGROUND ART

To meet the recent demand for higher integration in integrated circuits, pattern formation to a finer feature size is required. Acid-catalyzed chemically amplified resist compositions are most often used in forming resist patterns with a feature size of 0.2 µm or less. High-energy radiation such as UV, deep-UV or electron beam (EB) is used as the light source for exposure of these resist compositions. In particular, the EB lithography which is utilized as the ultra-fine microfabrication technique is also indispensable in processing a photomask blank to form a photomask for use in semiconductor device fabrication.

In general, the EB lithography is by writing an image with EB, without using a mask. In the case of positive resist, those regions of a resist film other than the regions to be retained are successively irradiated with EB having a minute area. The operation of successively scanning all finely divided regions on the process surface takes a long time as compared with full wafer exposure through a photomask. In order to avoid any decline of throughput, the resist film must be highly sensitive. Because of the long image-writing time, there is a likelihood of a difference arising between the initially written portion and the later written portion. Thus the stability with time of exposed regions in vacuum is one of important performance requirements. One of the important applications of chemically amplified resist material resides in processing of mask blanks. Some mask blanks have a surface material that can have an impact on the pattern profile of the overlying resist, such as a film of a chromium compound, typically chromium oxide deposited on a photomask substrate. For high resolution and profile retention after etching, it is one important performance factor to maintain the pattern profile of resist film rectangular independent of the type of substrate.

The control of resist sensitivity and pattern profile as mentioned above has been improved by a proper selection and combination of resist material-constituting components and processing conditions. One problem to be improved is the diffusion of acid that largely affects the resolution of a chemically amplified resist material. In processing of photomasks, it is required that the profile of a resist pattern formed as above do not change with a lapse of time from the end of exposure to post-exposure baking. The major cause of such a change with time is diffusion of an acid generated upon exposure. The problem of acid diffusion has been widely studied not only in the field of photomask processing, but also in the field of general resist materials because it has a significant impact on sensitivity and resolution.

In particular, Patent Document 1 discloses that a sulfonic acid generated upon exposure is incorporated into a resin for use in resist material for inhibiting acid diffusion. This control method is attractive since it relies on a mechanism different from the control method using a base. Various improvements have been made on this method to comply with the demand of forming finer size patterns. Patent Document 2 is a useful example of achieving an improvement in acid strength.

CITATION LIST

Patent Document 1: JP-A H09-325497
Patent Document 2: JP-A 2008-133448 (U.S. Pat. No. 7,569,326)
Patent Document 3: JP-A 2007-197718
Patent Document 4: JP-A 2008-102383
Patent Document 5: JP-A 2008-304590

DISCLOSURE OF INVENTION

Polymers comprising a major proportion of aromatic ring structure having an acidic side chain, for example, polyhydroxystyrene have been widely used in resist materials for the KrF excimer laser lithography. These polymers are not used in resist materials for the ArF excimer laser lithography since they exhibit strong absorption at a wavelength of around 200 nm. These polymers, however, are expected to form useful resist materials for the EB and EUV lithography because they offer high etch resistance. It would be desirable to have a photoresist composition using such a polymer having high etch resistance.

An object of the invention is to provide a chemically amplified positive photoresist composition suited for use in forming a resist pattern having high etch resistance, comprising a polymer having a high proportion of aromatic ring structure-containing units and containing on a side chain an aromatic sulfonic acid sulfonium salt, that is, a side chain capable of acid generation, wherein the polymer substantially overcomes the problems of dissolution in solvents for polymerization and purification during polymer preparation and in resist solvents. Another object is to provide a resist pattern forming process using the photoresist composition.

Making a study on a resist material used in processing of a photomask blank comprising a chromium compound at the outermost surface, the inventors found that a resist material having etch resistance as high as possible is preferable in processing a chromium or similar material film essentially having a slow dry etching rate. In this regard, it was presumed preferable to use monomer units having an aromatic sulfonic acid side chain as described in Patent Document 1 rather than the monomer units described in Patent Document 2. Nevertheless, a polymer comprising as much as possible aromatic structure-containing monomer units and monomer units having an aromatic sulfonic acid sulfonium salt on a side chain which serve as an acid generator was found to give rise to a problem with respect to solubility in commonly used polymerization solvents and resist solvents. It is desired to overcome such problems.

The inventors have found that a polymer comprising a major proportion of aromatic ring-containing recurring units having the general formulae (2) and (3) or (2), (3) and (4), shown below, is improved by incorporating a sulfonium structure salt having the general formula (1), shown below, as additional recurring units. Specifically not only the polymer itself is improved in solubility in solvents for polymerization and purification during polymer preparation and in resist solvents, but also the profile of a pattern formed therefrom is improved. Particularly when recurring units having formula (1) are incorporated in an amount of up to 10 mol % of the entire recurring units, the polymer is free of precipitates which would otherwise form during synthesis, has a drastically increased solubility in resist solvents, and is capable of consistently forming a pattern even on a processable substrate having on its surface a chromium base or analogous material which tends to invite pattern stripping or pattern collapse upon pattern formation.

In one aspect, the invention provides a chemically amplified positive photoresist composition comprising a polymer comprising recurring units having the general formulae (1) to (3) or (1) to (4).

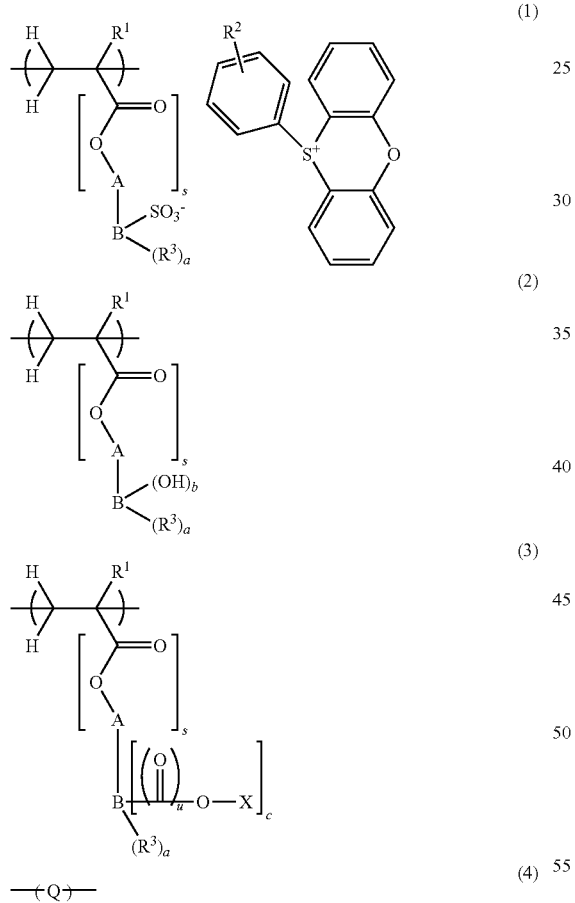

group comprising up to 3 aromatic rings, s is each independently 0 or 1, u is 0 or 1, a is each independently an integer of 0 to 3, b and c are each independently an integer of 1 to 3, X is an acid labile group when c is 1, X is hydrogen or an acid labile group when c is 2 or 3, at least one X being an acid labile group, and Q has the general formula (5) or (6):

wherein $R^6$ is each independently hydrogen, hydroxyl, $C_1$-$C_7$ alkylcarbonyloxy or $C_1$-$C_6$ alkyl, alkoxy, haloalkyl or haloalkoxy group, and d is an integer of 0 to 4. The units of formula (1) account for up to 10 mol % based on the entire units of the polymer.

In formula (1), the structure represented by the following formula:

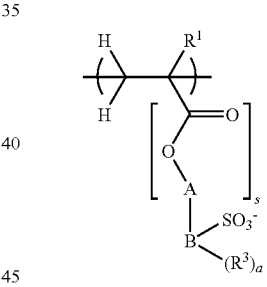

is preferably selected from structures having the following formulae.

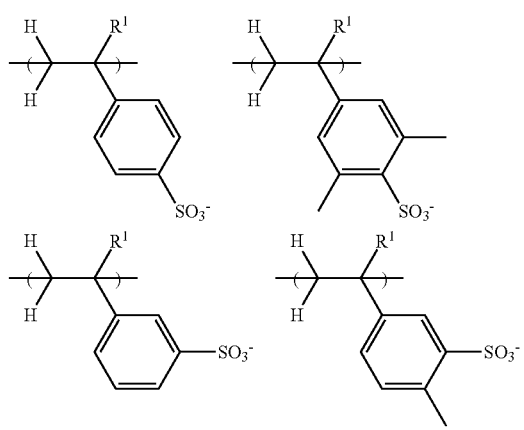

Herein $R^1$ is hydrogen, fluorine, methyl or trifluoromethyl, $R^2$ is hydrogen, a substituted or unsubstituted, straight, branched or cyclic $C_1$-$C_{10}$ alkyl group, or a substituted or unsubstituted, straight, branched or cyclic $C_1$-$C_{10}$ alkoxy group, $R^3$ is each independently a $C_1$-$C_{10}$ alkyl group, A is a single bond or a divalent $C_1$-$C_{10}$ organic group which may be separated by an ether bond, B is a benzene ring or fused polycyclic aromatic

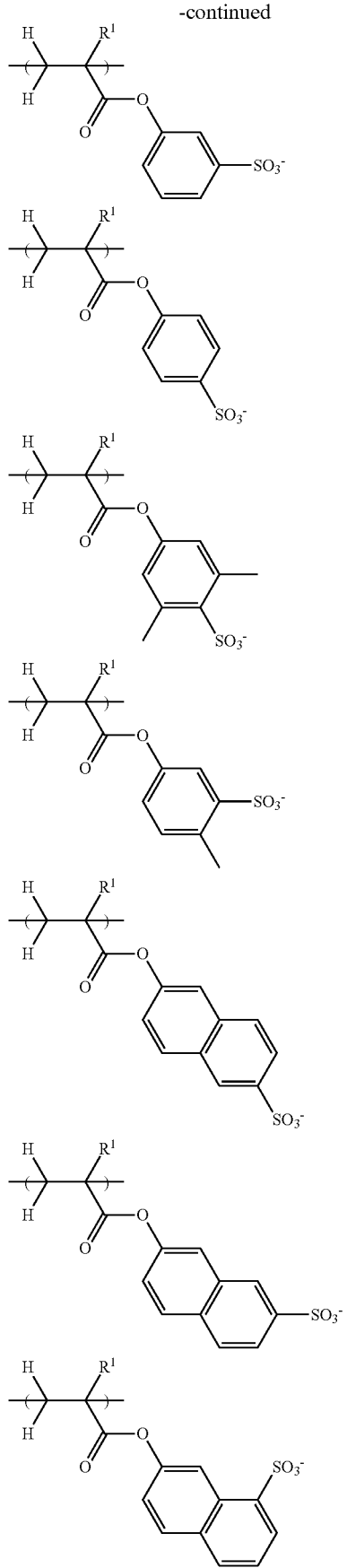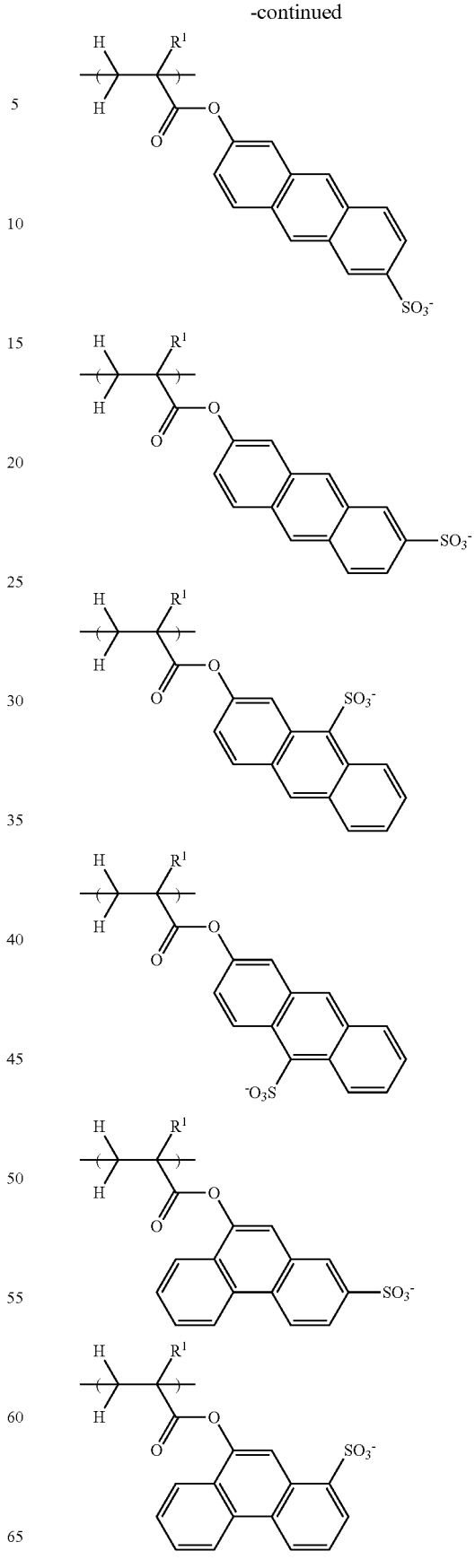

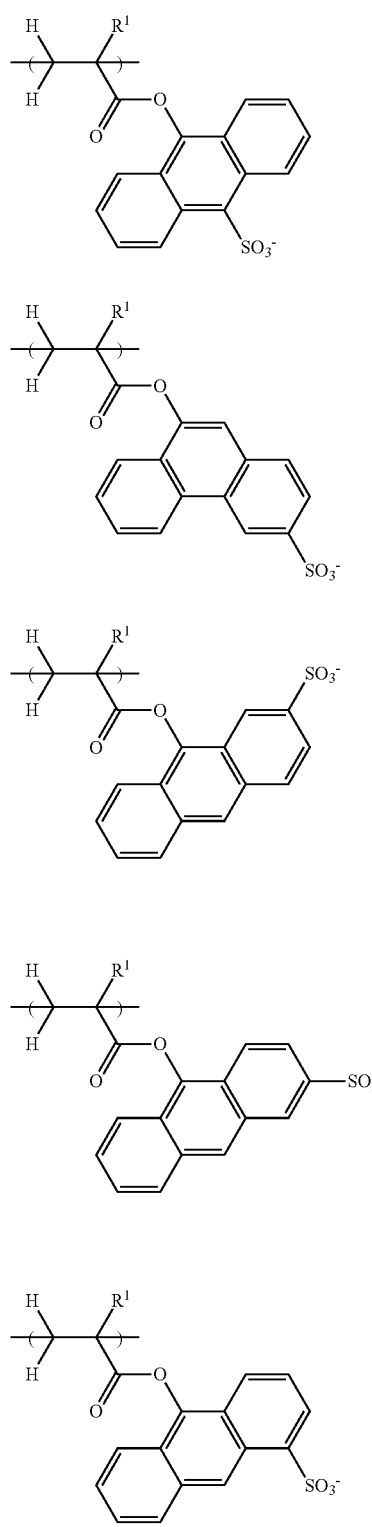
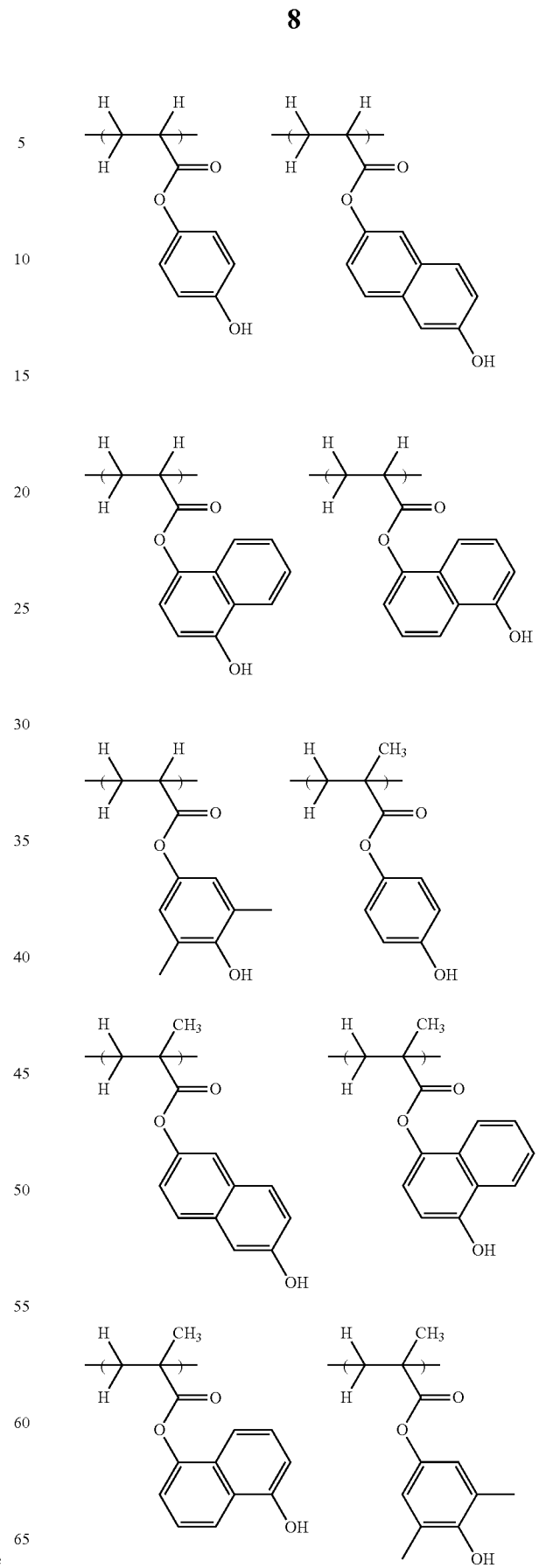
Herein R[1] is as defined above.
The unit of formula (2) is preferably selected from the following formulae.

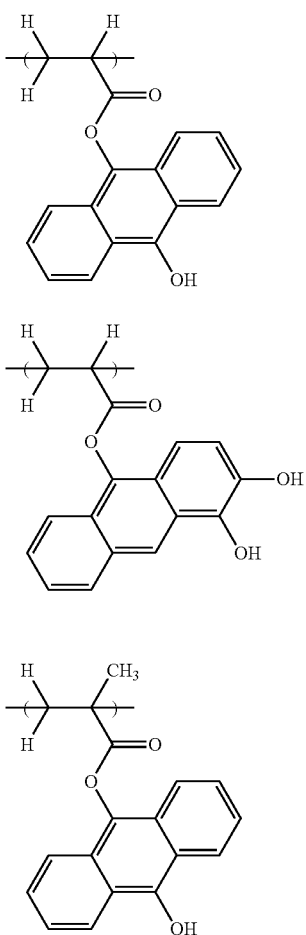

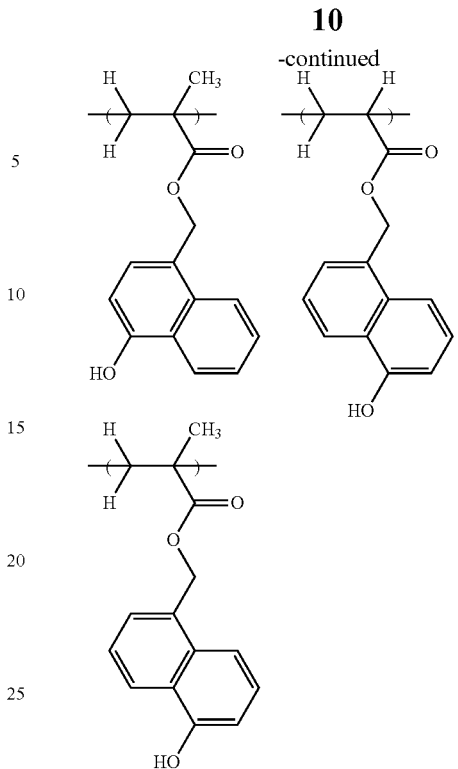

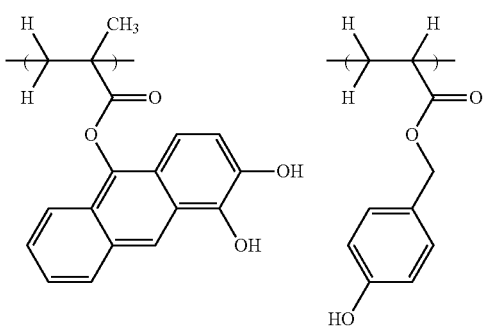

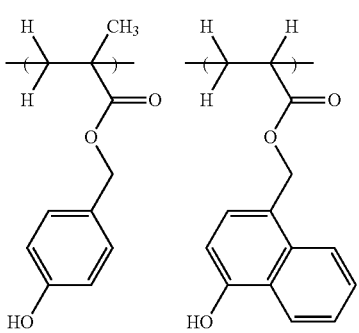

The unit of formula (2) is also preferably a unit derived from a monomer selected from the group consisting of 3-hydroxystyrene, 4-hydroxystyrene, 5-hydroxy-2-vinylnaphthalene, 6-hydroxy-2-vinylnaphthalene, and 7-hydroxy-2-vinylnaphthalene.

In a preferred embodiment, the acid labile group is a $C_4$-$C_{18}$ tertiary alkyl group or an acetal group of the following formula (7):

$$\begin{array}{c} R^7 \\ | \\ -O-C-O-Y \end{array} \tag{7}$$

wherein $R^7$ is hydrogen or a straight, branched or cyclic $C_1$-$C_{10}$ alkyl group, and Y is a straight, branched, cyclic or polycyclic $C_1$-$C_{30}$ alkyl group.

In another aspect, the invention provides a process for forming a resist pattern, comprising the steps of applying the chemically amplified photoresist composition defined above onto a processable substrate to form a resist film, exposing the resist film to a pattern of high-energy radiation, and developing the exposed resist film with an alkaline developer to form a resist pattern.

Typically the high-energy radiation is EUV or electron beam. Often, the processable substrate comprises an outermost surface layer of chromium-containing material.

ADVANTAGEOUS EFFECTS OF INVENTION

The photoresist composition comprises a specific polymer as a base resin, which polymer is fully soluble in solvents commonly used for polymerization and purification and in resist solvents, for example, methanol, tetrahydrofuran, toluene, methyl ethyl ketone, acetone, ethyl acetate, methyl isobutyl ketone, γ-butyrolactone, cyclohexanone, propylene glycol monomethyl ether (PGME), propylene glycol monomethyl ether acetate (PGMEA), and ethyl lactate. The photoresist composition is capable of consistently forming a pattern even on a processable substrate having on its surface a chromium base or analogous material which tends to invite pattern stripping or pattern collapse upon pattern formation.

DESCRIPTION OF THE PREFERRED EMBODIMENT

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. As used herein, the terminology "($C_x$-$C_y$)", as applied to a particular unit, such as, for example, a chemical compound or a chemical substituent group, means having a carbon atom content of from "x" carbon atoms to "y" carbon atoms per such unit. As used herein, the term "film" is used interchangeably with "coating" or "layer."

The polymer used in the chemically amplified positive photoresist composition of the invention is defined as comprising recurring units having the general formulae (1) to (3) or formulae (1) to (4).

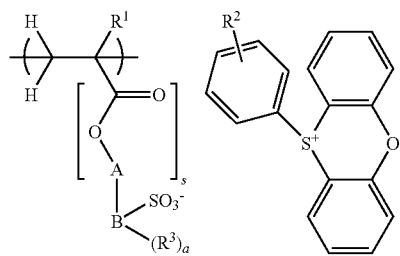
(1)

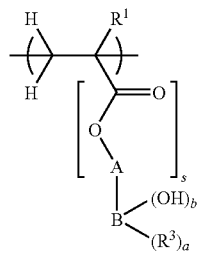
(2)

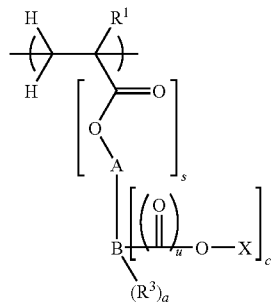
(3)

(4)

Herein $R^1$ is hydrogen, fluorine, methyl or trifluoromethyl. $R^2$ is hydrogen, a substituted or unsubstituted, straight, branched or cyclic $C_1$-$C_{10}$ alkyl group, or a substituted or unsubstituted, straight, branched or cyclic $C_1$-$C_{10}$ alkoxy group. $R^3$ is each independently a $C_1$-$C_{10}$ alkyl group. A is a single bond or a divalent $C_1$-$C_{10}$ organic group which may be separated by an ether bond. B is a benzene ring or a fused polycyclic aromatic group comprising up to 3 aromatic rings. The subscript s is each independently 0 or 1, u is 0 or 1, a is each independently an integer of 0 to 3, b and c are each independently an integer of 1 to 3. X is an acid labile group when c is 1. X is hydrogen or an acid labile group when c is 2 or 3, at least one X being an acid labile group. Q is a unit of the general formula (5) or (6):

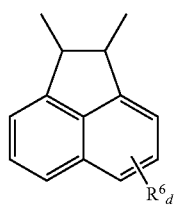
(5)

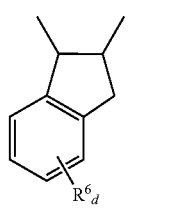
(6)

wherein $R^6$ is each independently hydrogen, hydroxyl, a $C_1$-$C_7$ alkylcarbonyloxy group or a $C_1$-$C_6$ alkyl, alkoxy, haloalkyl or haloalkoxy group, and d is an integer of 0 to 4. The units of formula (1) account for up to 10 mol % based on the entire units of the polymer. The polymer is described in detail by referring to the respective recurring units.

Incorporated in the polymer are recurring units having the general formula (1).

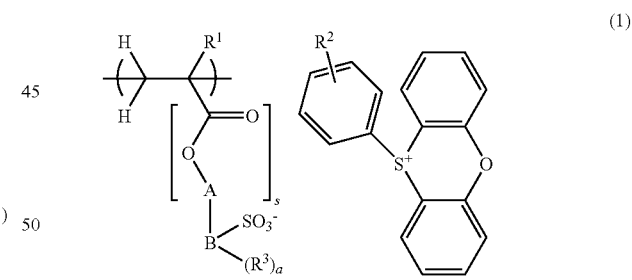
(1)

Herein $R^1$ is hydrogen, fluorine, methyl or trifluoromethyl. $R^2$ is hydrogen, a substituted or unsubstituted, straight, branched or cyclic $C_1$-$C_{10}$ alkyl group, or a substituted or unsubstituted, straight, branched or cyclic $C_1$-$C_{10}$ alkoxy group. $R^3$ is each independently a alkyl group. A is a single bond or a divalent $C_1$-$C_{10}$ organic group which may be separated by an ether bond. B is a benzene ring or a fused polycyclic aromatic group comprising up to 3 aromatic rings. The subscript s is 0 or 1, and "a" is an integer of 0 to 3.

The recurring unit of formula (1) is a constituent unit capable of generating an aromatic sulfonic acid side chain upon exposure to high-energy radiation. The aromatic structure B is selected from a benzene ring and a fused polycyclic aromatic group comprising up to 3 aromatic rings, for example, benzene, naphthalene, anthracene, and phenanthrene rings. A is a single bond or a divalent $C_1$-$C_{10}$ organic group which may be substituted with an oxygen atom.

Those units in which the sulfonium cation is triphenylsulfonium are already disclosed in Patent Document 1. When such units are used to polymerize a polymer having a very high proportion of aromatic ring structure, the resulting polymer is least soluble in resist solvents. In some formulations, the product will precipitate out of the reaction solution during polymerization reaction. Quite unexpectedly, the inventors have found that the polymer is improved in solubility by providing the sulfonium cation with a phenoxathiin structure as shown by formula (1) and controlling the percent incorporation of phenoxathiin structure-bearing units in the polymer. When a pattern is formed using the resulting polymer, the pattern is improved in profile.

Preferred examples providing units of formula (1) are shown below by structural formulae (depicted as formula (1) with the sulfonium cation being omitted).

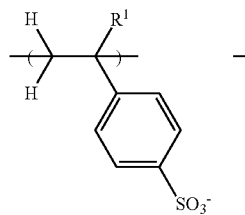

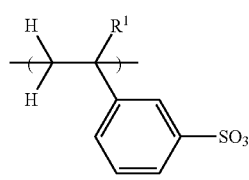

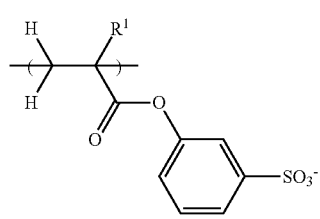

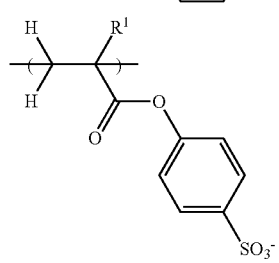

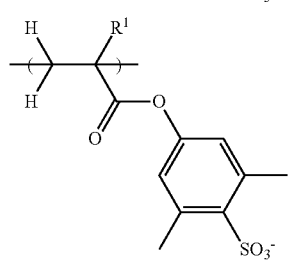

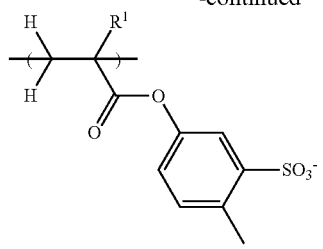

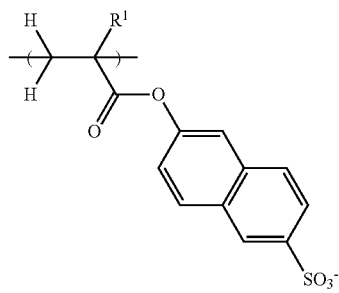

-continued

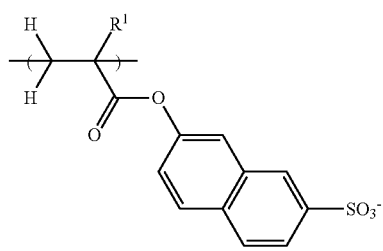

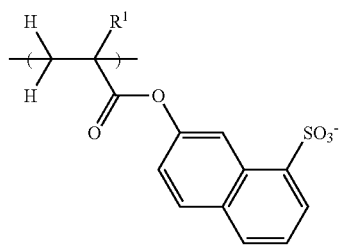

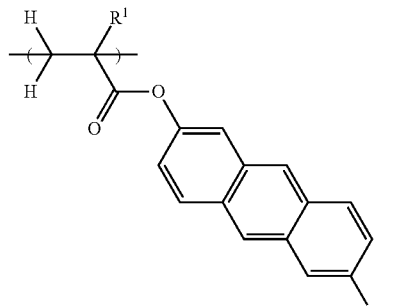

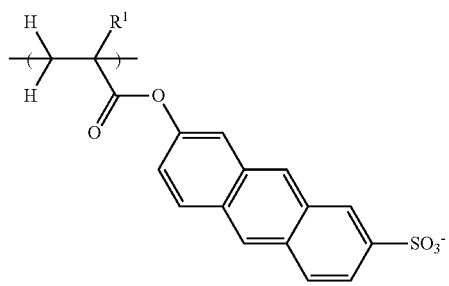

-continued

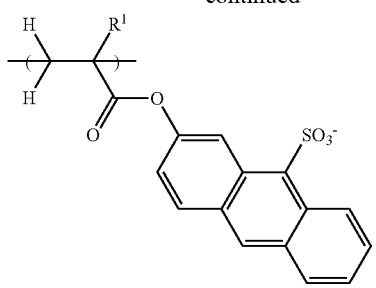
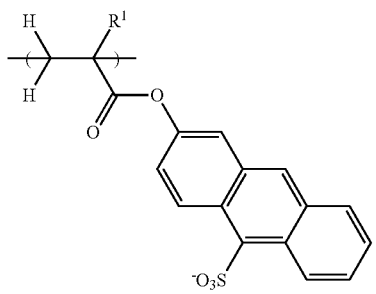
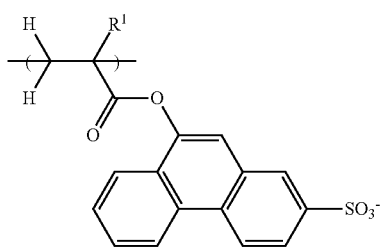
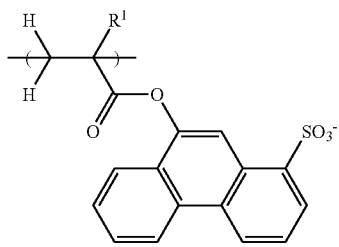
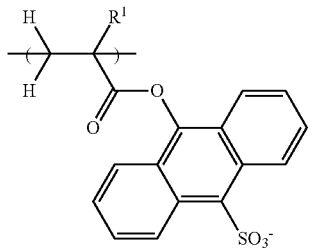
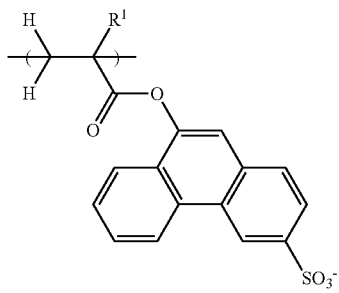

-continued

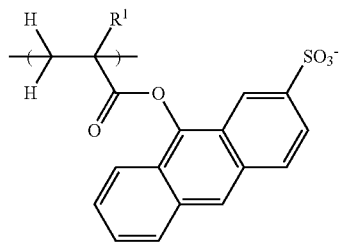
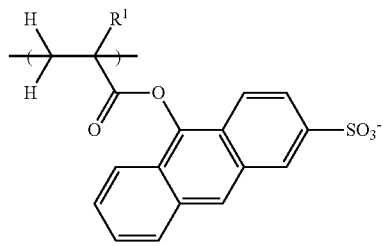
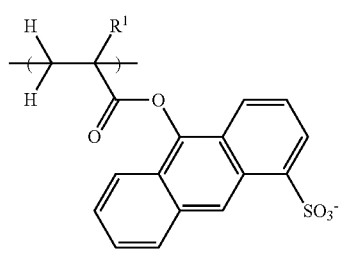

Herein $R^1$ is as defined above.

The sulfonium cation moiety omitted from the above-illustrated structures is a sulfonium cation having phenoxathiin structure. The substituent $R^2$ on the phenyl group attached to the sulfur atom is selected from among hydrogen, substituted or unsubstituted, straight, branched or cyclic $C_1$-$C_{10}$ alkyl groups, and substituted or unsubstituted, straight, branched or cyclic $C_1$-$C_{10}$ alkoxy groups. When $R^2$ is an alkyl or alkoxy group, preferred examples of the alkyl moiety include methyl, ethyl, propyl, isopropyl, butyl, tert-butyl, pentyl, tert-amyl, neopentyl, cyclopentyl, hexyl, cyclohexyl, and norbornyl.

The polymer also comprises recurring units having the general formulae (2) and (3).

(2)

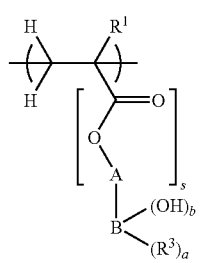

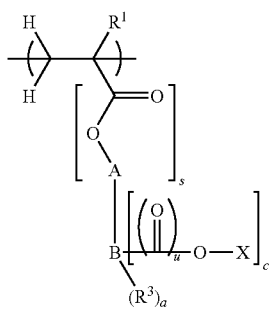

(3)

Herein R² is hydrogen, fluorine, methyl or trifluoromethyl. R³ is each independently a $C_1$-$C_{10}$ alkyl group. A is a single bond or a divalent $C_1$-$C_{10}$ organic group which may be separated by an ether bond. B is a benzene ring or fused polycyclic aromatic group comprising up to 3 aromatic rings. The subscript s is each independently 0 or 1, u is 0 or 1, a is each independently an integer of 0 to 3, b and c are each independently an integer of 1 to 3. In the case of c=1, X is an acid labile group. In the case of c=2 or 3, X is hydrogen or an acid labile group, at least one X being an acid labile group. The recurring units of formulae (2) and (3) account for the highest proportion among recurring units to constitute the polymer. Since the sulfonium cation moiety in the unit of formula (1) is phenoxathiin, the polymer is kept soluble in solvents even when these units having aromatic ring structure such as benzene, naphthalene, anthracene or phenanthrene ring (including units of formula (4) to be described later) are incorporated in a higher ratio.

The units of formulae (2) and (3) provide a main function of dominating a dissolution phenomenon in alkaline developer. Of the units of formulae (2) and (3), for example, a compound used as the unit of formula (3) may be a derivative of a compound selected as the unit of formula (2) or a distinct compound. For each of formulae (2) and (3), the units may be either of one type or of plural types. Accordingly, in formulae (2) and (3), the structure of A, and the values of s and u may be the same or different.

The recurring units of formula (2) provide the polymer with polarity to impart an adhesive function. Preferred examples of the units of formula (2) having the linker (—CO—O-A-) are given below.

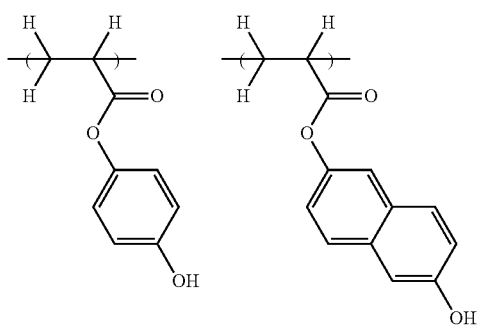

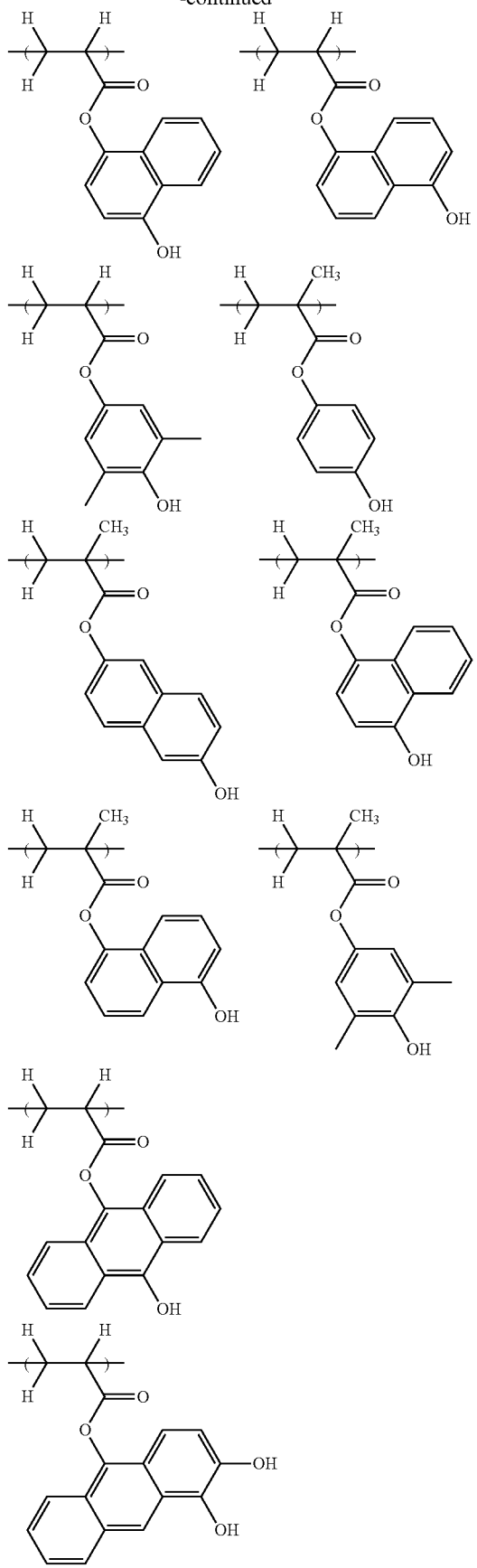

-continued

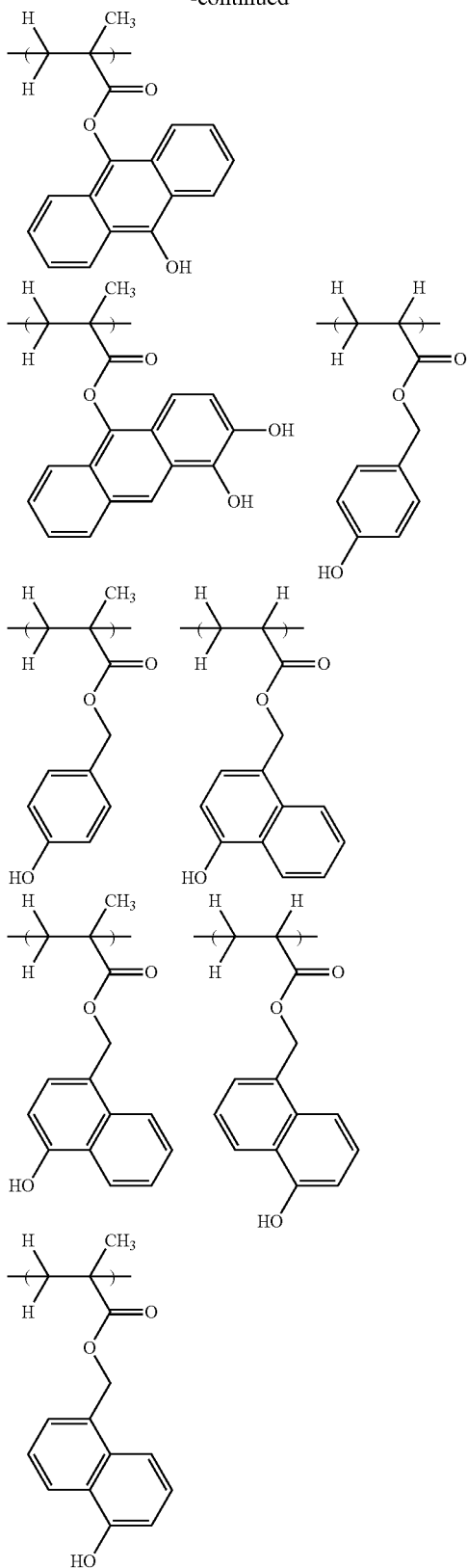

Preferred examples of the units of formula (2) not having the linker include units derived from those monomers in which a 1-substituted or unsubstituted vinyl group is attached to an aromatic ring having a hydroxyl group substituted thereon, as typified by hydroxystyrene units. Specific preferred examples include 3-hydroxystyrene, 4-hydroxystyrene, 5-hydroxy-2-vinylnaphthalene, 6-hydroxy-2-vinylnaphthalene, and 7-hydroxy-2-vinylnaphthalene.

The units capable of imparting adhesion to the polymer may be of one type or a combination of plural types and incorporated in a range of 30 to 80 mol % based on the entire recurring units of the polymer. It is noted that where units of the general formula (4) capable of imparting higher etch resistance to the polymer are used, as will be described later, and these units have a phenolic hydroxyl group as a substituent group, the content of adhesion-imparting units plus etch resistance-improving units preferably falls within the range.

The unit of formula (3) corresponds to a form of the unit of formula (2) in which at least one phenolic hydroxyl group substituting on the aromatic ring is replaced by an acid labile group, or in which a phenolic hydroxyl group is replaced by a carboxyl group and the resultant carboxylic acid is protected with an acid labile group. Generally the acid labile group used herein may be any of many well-known acid labile groups which are used in conventional chemically amplified positive resist compositions and which are eliminatable with the aid of acid to give an acidic group.

Independent of whether the phenolic hydroxyl group or the carboxyl group is protected, it is preferred to select a tertiary alkyl group as the acid labile group for protection because even when a fine size pattern having a line width of up to 45 nm, for example, is formed from a thin resist film having a thickness of 10 to 100 nm, the pattern is minimized in edge roughness (phenomenon that the pattern edge becomes of irregular shape). The tertiary alkyl groups used herein are preferably those of 4 to 18 carbon atoms because the monomers for polymerization are typically recovered by distillation. Suitable alkyl substituent groups on the tertiary carbon of the tertiary alkyl group include straight, branched or cyclic alkyl groups of 1 to 15 carbon atoms which may contain, in part, an ether bond or an oxygen-containing functional group such as carbonyl group. The substituent groups may bond together to form a ring.

Preferred substituent groups on the tertiary carbon of the tertiary alkyl group include, but are not limited to, methyl, ethyl, propyl, adamantyl, norbornyl, tetrahydrofuran-2-yl, 7-oxanorbornan-2-yl, cyclopentyl, 2-tetrahydrofuryl, tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, tetracyclo[4.4.0.1$^{2,5}$.1$^{7,10}$]dodecyl, and 3-oxo-1-cyclohexyl. Examples of the tertiary alkyl group include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

Also acetal groups having the general formula (7) are often utilized as the acid labile group.

Herein $R^7$ is hydrogen or a straight, branched or cyclic $C_1$-$C_{10}$ alkyl group, and Y is a straight, branched or cyclic (inclusive of polycyclic) $C_1$-$C_{30}$ alkyl group. The acetal group is a useful alternative as the acid labile group capable of consistently forming a pattern which provides a rectangular interface between the pattern and the substrate. In particular, inclusion of a polycyclic alkyl group of 7 to 30 carbon atoms as Y is preferred to gain a higher resolution. Where Y is a polycyclic alkyl group, it is preferred that a bond form between the secondary carbon of the polycyclic structure and the acetal oxygen. This is because in case of a bond on the tertiary carbon of the cyclic structure, the polymer becomes unstable, resulting in the resist composition lacking storage stability and detracting from resolution. Inversely, if Y bonds on the primary carbon via a straight alkyl group of at least one carbon atom, the polymer may undergo a drop of glass transition temperature (Tg) during baking, allowing the resist pattern as developed to encounter profile failure.

Examples of the acid labile group having formula (7) are given below.

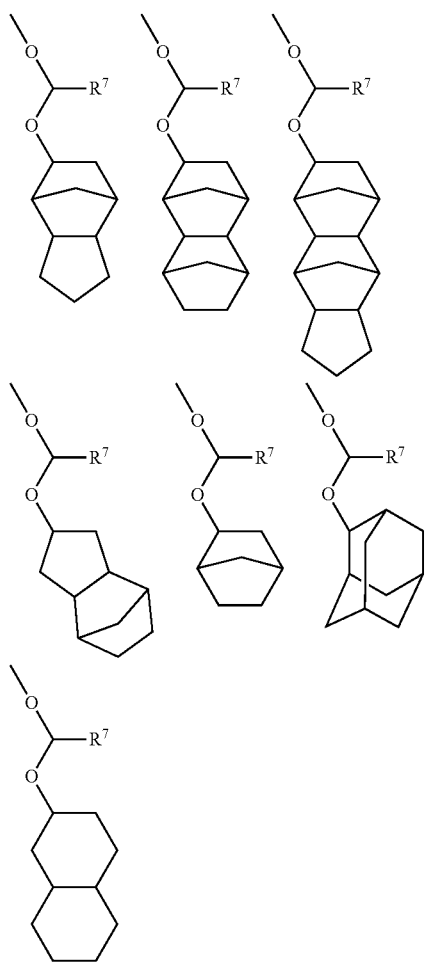

While $R^7$ is hydrogen or a straight, branched or cyclic $C_1$-$C_{10}$ alkyl group, an appropriate group may be selected for $R^7$ in accordance with the design of sensitivity of labile group to acid. For example, hydrogen is selected if the labile group is designed to be decomposable with strong acid while insuring relatively high stability; and a straight alkyl group is selected if the labile group is designed to provide high sensitivity to a pH change utilizing relatively high reactivity. In the event that the labile group is designed to undergo a substantial solubility change with decomposition by substituting a relatively bulky alkyl group at the end as above, a group in which the carbon bonding to the acetal carbon is secondary carbon is preferably selected for $R^7$, depending on a combination with an acid generator and basic compound to be compounded in the resist composition. Examples of the group $R^7$ having secondary carbon bonding to the acetal carbon include isopropyl, sec-butyl, cyclopentyl, and cyclohexyl.

An alternative that —$CH_2COO$— (tertiary alkyl group) is bonded to the oxygen atom of a phenolic hydroxyl group may be selected as the acid labile group. It is an acid labile group of exceptional structure in that it is not a protective group for a hydroxyl group. The tertiary alkyl group used herein may be the same as the foregoing tertiary alkyl group used for the protection of a phenolic hydroxyl group.

The units of formula (3) that are protected with an acid labile group and adapted to turn alkali soluble under the action of acid may be used alone or in a combination of plural types and preferably incorporated in a range of more than 0 mol % to 50 mol %, more preferably 5 mol % to 45 mol %, based on the entire recurring units of the polymer. Where $R^6$ in the general formula (5) or (6) to be described later is a tertiary alkoxy group, like in the case of formula (2) described above, the proportion of the units of formula (3) plus units of formula (5) or (6) preferably falls in the range.

To the polymer used herein, units having the general formula (4):

may be incorporated as main constituent units for improving etch resistance. Herein Q has the general formula (5) or (6):

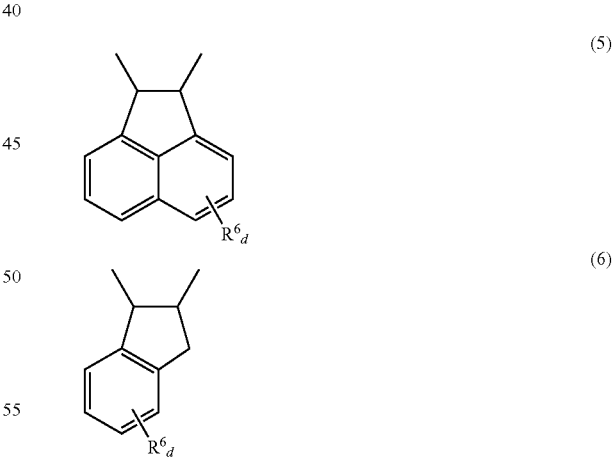

wherein $R^6$ is each independently hydrogen, hydroxyl, a $C_1$-$C_7$ alkylcarbonyloxy or a $C_1$-$C_6$ alkyl, alkoxy, haloalkyl or haloalkoxy group, and d is an integer of 0 to 4. These units are selected from units having an acenaphthylene and indene structure. Inclusion of the units of formula (4) as constituent units exerts, in addition to the etch resistance inherent to aromatic ring, an effect of enhancing resistance to EB irradiation during etching or pattern inspection operation, due to the addition of cyclic structure to the main chain.

The resist composition comprising the polymer exhibits better characteristics including satisfactory etch resistance and high resolution when the total amount of units of formulae (1) to (3) where units of formula (4) are not incorporated, or the total amount of units of formulae (1) to (4) where units of formula (4) are incorporated accounts for at least 70 mol %, preferably at least 85 mol %, and more preferably at least 90 mol % based on the entire monomeric units of the polymer. Particularly when the total amount accounts for at least 90 mol %, specifically at least 95 mol %, and more specifically at least 98 mol %, the resist composition exhibits better etch resistance than the resist film described in Patent Document 2. Additional recurring units other than formulae (1) to (4) which can be incorporated into the polymer include (meth) acrylic acid ester units protected with ordinary acid labile groups, and (meth)acrylic acid ester units having adhesive groups of lactone or other structure, as described in Patent Document 2. Some properties of a resist film may be finely adjusted by incorporating such additional recurring units although the additional recurring units may be omitted.

There may be used adhesion-imparting units other than the adhesion-imparting recurring units having an aromatic ring structure therein. Suitable other adhesion-imparting units include those of the general formulae (8), (9), and (10).

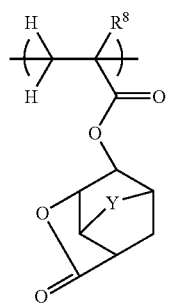

(8)

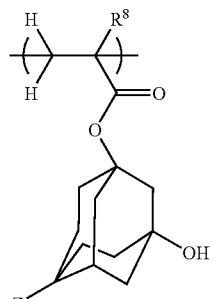

(9)

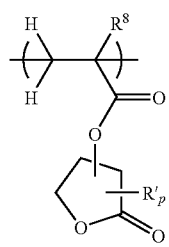

(10)

Herein $R^8$ is hydrogen, methyl or trifluoromethyl, Y is an oxygen atom or methylene group, and Z is hydrogen or hydroxyl. R' is a monovalent hydrocarbon group having 1 to 3 carbon atoms, and p is an integer of 0 to 4. The content of other adhesion-imparting units is preferably limited to a range of up to 15 mol %, more preferably up to 10 mol % based on the entire recurring units of the polymer because the other adhesion-imparting units may detract from etch resistance when used as main adhesion-imparting units.

The polymer used herein should comprise recurring units of formula (1) in a proportion of up to 10 mol %, preferably up to 5 mol %, and at least 1 mol % as the lower limit, based on the entire recurring units. If the proportion of recurring units of formula (1) is less than 1 mol %, then an acid generator not bound to a polymer must be separately added in a relatively large amount in order to provide an effective sensitivity, which may rather prevent the polymer-bound acid generator from exerting its effect. If the proportion of recurring units of formula (1) is more than 10 mol %, then several problems may arise such as precipitation and difficult purification during synthesis of a polymer and a low solubility of the polymer in resist solvents. A further problem is an increased likelihood of pattern stripping when a resist pattern is formed on a substrate having on its surface a chromium base or analogous material which tends to invite pattern stripping.

When units of formula (4) are incorporated in the polymer, they preferably account for at least 5 mol % based on the entire recurring units. If the proportion of recurring units of formula (4) is less than 5 mol %, then the benefit of etch resistance may be blurred. Where the unit of formula (5) or (6) is a unit whose functional group has a polarity to impart substrate adhesion or a unit whose substituent group is protected with an acid labile group as mentioned above and becomes an alkali soluble group under the action of acid, the proportion of units of formula (4) is combined with the proportion of the units of the same function so that the sum may fall in the preferred range defined above. Where units of formula (4) have not a functional group or have a functional group distinct from the foregoing, the proportion of units of formula (4) is preferably up to 30 mol %. If the proportion of units of formula (4) having no functional group or having a distinct functional group is in excess of 30 mol %, then they may cause development defects.

The polymer comprising recurring units of formulae (1) to (3) or formulae (1) to (4) may be prepared by any well-known methods, specifically by copolymerizing selected monomers while combining protection and deprotection reactions, if necessary. The copolymerization reaction is not particularly limited although radical, anionic or coordination polymerization is preferred. With respect to the polymerization methods, reference may be made to Patent Documents 2 to 3.

The polymer has a molecular weight, preferably a weight average molecular weight (Mw) of 2,000 to 50,000, more preferably 3,000 to 20,000, as measured by gel permeation chromatography (GPC) versus polystyrene standards. If Mw is less than 2,000, the polymer may be reduced in resolution and the pattern may be rounded at the top and degraded in line edge roughness (LER), as is well known in the art. On the other hand, if Mw is greater than the necessity, the LER tends to increase, depending on the pattern to be resolved. Particularly when a pattern having a line width of up to 100 nm is to be formed, the polymer is preferably controlled to a Mw of 20,000 or less. It is noted that the GPC measurement generally uses tetrahydrofuran (THF) solvent. Some polymers within the scope of the invention do not dissolve in THF, and in this event, GPC measurement is made in dimethylformamide (DMF) solvent having up to 100 mM of lithium bromide added thereto.

The polymer should preferably be narrow disperse as demonstrated by a dispersity (Mw/Mn) of 1.0 to 2.0, more preferably 1.0 to 1.8. If the dispersity is wider, the pattern after development may have foreign particles deposited thereon, or the pattern profile may be degraded.

The resist composition of the invention may exert resist performance when a solvent is added to the polymer. If necessary, a basic compound, acid generator, another polymer, surfactant and other components may be added.

Any desired solvent may be used as long as a base resin mainly comprising the polymer disclosed herein, a basic compound and other components are soluble therein. It may be selected from those solvents well known for use in resist compositions. Illustrative, non-limiting, examples include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether (PGME), propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol alkyl ether acetates such as propylene glycol methyl ether acetate (PGMEA), propylene glycol ethyl ether acetate, and propylene glycol propyl ether acetate, alkyl lactates such as methyl lactate, ethyl lactate, and propyl lactate, and tetramethylene sulfone.

Of these, the propylene glycol alkyl ether acetates and alkyl lactates are especially preferred. The solvents may be used alone or in admixture of two or more. An exemplary useful solvent mixture is a mixture of propylene glycol alkyl ether acetates and/or alkyl lactates. It is noted that the alkyl moieties of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl moieties of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent.

In the resist composition, the solvent is preferably used in an amount of 300 to 7,000 parts by weight, especially 1,000 to 5,000 parts by weight per 100 parts by weight of the solids. The concentration of the composition is not limited thereto as long as a film can be formed by existing methods.

In fact, the basic compound is an essential component in chemically amplified resist compositions wherein an acid generating unit is not incorporated into a polymer. The basic compound is preferably added to the resist composition of the invention as well in order to provide a high resolution or to adjust to a proper sensitivity. An appropriate amount of the basic compound added is 0.01 to 5 parts, more preferably 0.05 to 3 parts by weight per 100 parts by weight of the base resin.

A choice may be made of numerous basic compounds which are known in the art as disclosed in Patent Documents 1 to 3. Known basic compounds include primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amides, imides, carbamates, and ammonium salts. Many examples of these compounds are described in Patent Document 2, and any of them may be used herein. Two or more basic compounds may be selected and used in admixture. Preferred examples of the basic compound to be formulated include tris(2-(methoxymethoxy)ethyl) amine N-oxide, morpholine derivatives, and imidazole derivatives.

In a situation where a resist pattern is formed on a substrate which causes a phenomenon that a positive pattern becomes difficulty dissolvable at the interface with the substrate during pattern formation, namely the pattern takes a so-called footing profile, typically a substrate having a surface layer of chromium compound, the pattern profile may be improved when an amine compound or amine oxide compound having a carboxyl group, but free of hydrogen in covalent bond with nitrogen serving as basic center (excluding an amine or amine oxide compound having nitrogen included in aromatic ring structure) is used.

The amine or amine oxide compounds having a carboxyl group, but free of hydrogen in covalent bond with nitrogen serving as basic center are preferably amine or amine oxide compounds having at least a carboxyl group, but free of hydrogen in covalent bond with nitrogen serving as basic center, represented by the general formulae (11) to (13), though not limited thereto.

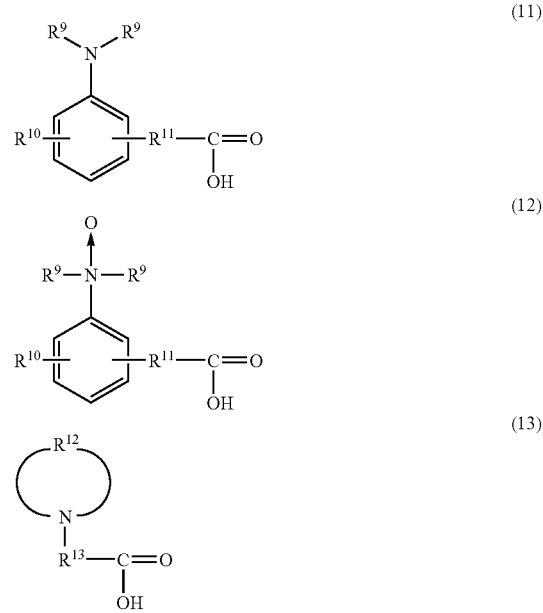

Herein $R^9$ is each independently a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl, or $C_2$-$C_{10}$ alkylthioalkyl group, or two $R^9$ may bond together to form a cyclic structure with the nitrogen atom to which they are attached. $R^{10}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl, $C_2$-$C_{10}$ alkylthioalkyl group, or halogen. $R^{11}$ is a single bond, a straight, branched or cyclic $C_1$-$C_{20}$ alkylene group, or $C_6$-$C_{20}$ arylene group. $R^{12}$ is an optionally substituted, straight or branched $C_2$-$C_{20}$ alkylene group, with the proviso that one or more carbonyl, ether (—O—), ester (—COO—) or sulfide group may intervene between carbon atoms of the alkylene group. $R^{13}$ is a straight, branched or cyclic $C_1$-$C_{20}$ alkylene group or $C_6$-$C_{20}$ arylene group.

Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_2$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and similar groups having alkyl isomers. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_2$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl. Suitable $C_6$-$C_{20}$ arylene groups include phenylene, naphthylene, anthracenylene, and tetrahydronaphthylene. Suitable straight, branched or cyclic $C_1$-$C_{20}$ alkylene groups include methylene, methylmethine, ethylmethine, propylmethine, isopropylmethine, butylmethine, sec-butylmethine, isobutylmethine, 1,2-ethylene, 1,2-propylene, 1,3-propylene, 1,2-butylene, 1,4-butylene, 1,2-pentene, 1,2-hexene, 1,6-hexene, 1,2-cyclohexene, and 1,4-cyclohexylene. The foregoing groups are merely exemplary and not limitative.

Examples of the amine compound having a carboxyl group, but free of hydrogen in covalent bond with nitrogen serving as basic center represented by formula (11) include, but not limited thereto, o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalic acid, 3-diethylamino-2-naphthalic acid, 3-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllacetic acid, 2-(4-dimethylaminophenyl)benzoic acid, and 2-(4-dibutylamino)-2-hydroxybenzoyl)benzoic acid.

Examples of the amine compound having a carboxyl group, but free of hydrogen in covalent bond with nitrogen serving as basic center represented by formula (12) include, but not limited thereto, oxidized forms of the amine compounds exemplified above.

Examples of the amine compound having a carboxyl group, but free of hydrogen in covalent bond with nitrogen serving as basic center represented by formula (13) include, but not limited thereto, 1-piperidinepropionic acid, 1-piperidinebutyric acid, 1-piperidinemalic acid, 1-piperidinepyruvic acid, and 1-piperidinelactic acid.

Some compounds having the amine oxide structure of formula (12) are existing compounds while some are novel. The compound having the amine oxide structure may be prepared by an optimum method selected in accordance with a particular structure. Exemplary methods include a method utilizing oxidative reaction using a nitrogen-containing compound as an oxidizing agent, and a method utilizing oxidative reaction in a solution of a nitrogen-containing compound diluted with aqueous hydrogen peroxide, but are not limited thereto. The preparation method is described in detail.

The preparation of a nitrogen-containing alcohol compound by esterification reaction is illustrated by the following reaction scheme, for example, and this method is applicable to the synthesis of compounds having formula (12).

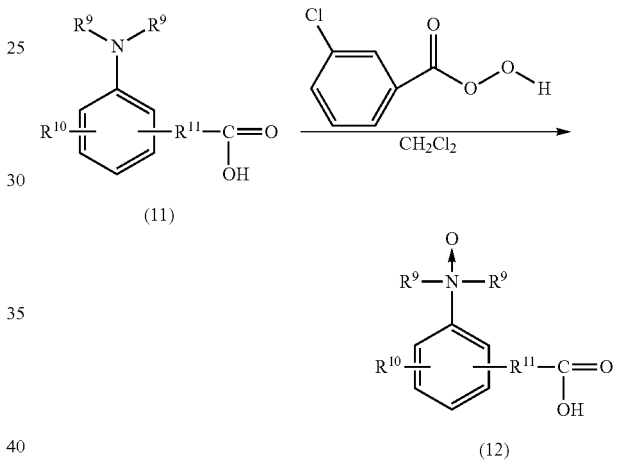

Herein $R^9$ to $R^{11}$ are as defined above.

While the reaction in the above scheme is an oxidative reaction of an amine using an oxidizing agent (m-chloroperbenzoic acid), such reaction may also be performed using another oxidizing agent commonly used in oxidative reaction. After reaction, the reaction mixture may be purified by standard techniques such as distillation, chromatography and recrystallization. See Patent Document 4.

The resist composition of the invention is characterized by controlled acid diffusion in that the recurring units having formula (1) in the polymer are capable of generating an acid upon exposure to high-energy radiation, and the acid thus generated is bound to the polymer so that acid diffusion is controlled. In this sense, essentially another acid generator need not be added to the resist composition. However, when it is desired to increase sensitivity or to improve roughness or the like, another acid generator may be added as an auxiliary in a small amount. If the other acid generator is added in excess, the effect assigned to the polymer-bound acid generator may be lost. Then the amount of the other acid generator added should preferably be less than the molar equivalent based on the structure having formula (1) contained as recurring units in the polymer, and more preferably up to one half of the molar equivalent based on the structure having formula (1).

The other acid generator which is added separate from the polymer may be selected from well-known acid generators (examples of which are enumerated in Patent Documents 1 to 3), depending on desired properties to be tailored. Specifically the amount of the other acid generator added is preferably less than 15 parts, more preferably up to 10 parts by weight per 100 parts by weight of the polymer because addition of at least 15 pbw of the other acid generator can detract from the effect of the polymer-bound acid generator. The addition amount is preferably up to 5 pbw particularly when the other acid generator is to generate a sulfonic acid having a low molecular weight, for example, a sulfonic acid of up to 6 carbon atoms. As to the lower limit, the amount of the other acid generator is at least 0 pbw, and preferably at least 0.1 pbw for exerting a noticeable effect.

The resist composition is characterized by comprising the polymer comprising recurring units having formulae (1) to (3) or formulae (1) to (4) wherein these recurring units account for at least 70 mol %, preferably at least 85 mol %, more preferably at least 90 mol % based on the entire recurring units, and the units of formula (1) account for up to 10 mol %, preferably up to 5 mol % based on the entire recurring units. The polymer comprising recurring units having formulae (1) to (3) or formulae (1) to (4) may be used alone or in admixture of two or more types. Besides, there may be added a polymer comprising units capable of acid generation having a different structure from formula (1). In this embodiment, the polymer comprising units capable of acid generation having a different structure from formula (1) is preferably combined with the polymer comprising units of formula (1) in an amount of up to 30% by weight of the mixture.

Alternatively, a polymer free of acid generating units like formula (1) and adapted to turn alkali soluble under the action of acid, or a polymer which is alkali soluble independent of reaction with acid may be used in combination. As disclosed in Patent Document 2, examples of the additional polymer include (i) poly(meth)acrylic acid derivatives, (ii) norbornene derivative/maleic anhydride copolymers, (iii) hydrogenated products of ring-opening metathesis polymerization (ROMP) polymers, (iv) vinyl ether/maleic anhydride/(meth)acrylic acid derivative copolymers, and (v) polyhydroxystyrene derivatives. These polymers are well known for use in conventional chemically amplified positive resist compositions and belong to the class of polymers adapted to turn alkali soluble under the action of acid. Also an alkali soluble polymer may be added for the purposes of improving pattern profile and controlling formation of residues upon development. Examples of the polymer used for such purposes include a number of polymers well known for use in conventional chemically amplified negative resist compositions. Furthermore, fluorine-containing polymers as disclosed in Patent Document 5 may be added.

When the inventive polymer and another polymer free of units capable of acid generation are used in admixture, the mixing ratio of the inventive polymer is preferably at least 30% by weight and more preferably at least 50% by weight of the mixture. If the ratio of the inventive polymer is less than the range, defects may form during development. It is preferred that the inventive polymer and the other polymer be mixed such that those units having an aromatic ring structure may account for at least 70 mol % of the entire recurring units of the polymers combined. The other polymer is not limited to one type and a mixture of two or more polymers may be added. The use of plural polymers allows for easy adjustment of resist properties.

Optionally, the resist composition may further comprise a surfactant which is commonly used for improving the coating characteristics. A number of surfactants are known as enumerated in Patent Documents 1 to 5 and a choice may be made in accordance with such teaching. The surfactant may be added in an amount of up to 2 parts, and preferably up to 1 part by weight, per 100 parts by weight of the base resin in the resist composition. When used, the amount of surfactant added is preferably at least 0.01 pbw.

A pattern may be formed from the resist composition of the invention, using any well-known lithography. In general, the composition is applied onto a substrate for integrated circuitry fabrication (e.g., Si, $SiO_2$, SiN, SiON, TiN, WSi, BPSG, SOG, organic antireflective coating, etc.) or a substrate for mask circuitry fabrication (e.g., Cr, CrO, CrON, MoSi, etc.) by a suitable coating technique such as spin coating. The coating is prebaked on a hot plate at a temperature of 60 to 150° C. for 1 to 15 minutes, preferably 80 to 140° C. for 1 to 10 minutes, to form a resist film of 0.05 to 2.0 μm thick. A patterning mask having the desired pattern is then placed over the resist film, and the film exposed through the mask to high-energy radiation such as deep-UV, excimer laser or x-ray in a dose of 1 to 200 mJ/cm$^2$, and preferably 10 to 100 mJ/cm$^2$. Alternatively, pattern formation may be performed by writing with an electron beam directly. Light exposure may be done by a conventional exposure process or in some cases, by an immersion process of providing liquid impregnation between the mask and the resist. In the case of immersion lithography, a protective coating which is insoluble in water may be used. The resist film is then post-exposure baked (PEB) on a hot plate at 60 to 150° C. for 1 to 15 minutes, and preferably at 80 to 140° C. for 1 to 10 minutes. Finally, development is carried out using as the developer an aqueous alkali solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. These steps result in the formation of the desired pattern on the substrate.

The resist composition of the invention is effective in forming a resist pattern which is required to have high etch resistance and to experience a minimal change of line width even when the time from exposure to PEB is prolonged. The resist composition is advantageously applied to a processable substrate to form a pattern thereon, especially to a substrate having a surface layer of material which is difficult for the resist pattern to adhere so that pattern stripping or collapse is likely to occur, and specifically a substrate having a chromium compound film containing chromium and one or more light elements of oxygen, nitrogen and carbon deposited by sputtering.

EXAMPLE

Examples and Comparative Examples are given below by way of illustration and not by way of limitation. In Examples, Me stands for methyl. The compositional ratio of a copolymer is a molar ratio. A weight average molecular weight (Mw) is measured by gel permeation chromatography (GPC) versus polystyrene standards.

Synthesis Example

Synthesis Example 1-1

Synthesis of phenoxathiin-S-oxide

To a solution of 100 g (0.5 mole) of phenoxathiin in 1,600 g of acetic acid, 48.5 g (0.5 mole) of 35% aqueous hydrogen peroxide solution was added dropwise at room temperature. The mixture was stirred for 7 days at room temperature. The reaction solution was poured into 3,000 g of water whereupon white crystals precipitated. The crystals were collected by filtration and vacuum dried, obtaining the target compound. White crystals, 90 g (yield 83%).

Synthesis Example 1-2

Synthesis of 10-phenylphenoxathiinium Iodide

A solution of 40 g (0.18 mole) of phenoxathiin-5-oxide in 400 g of dichloromethane was stirred under ice cooling. To the solution, 65 g (0.6 mole) of trimethylsilyl chloride was added dropwise at a temperature below 20° C. The resulting solution was allowed to mature for 30 minutes at the temperature. Then, a Grignard reagent which had been prepared from 14.6 g (0.6 mole) of metallic magnesium, 67.5 g (0.6 mole) of chlorobenzene and 168 g of tetrahydrofuran (THF) was added dropwise at a temperature below 20° C. The reaction solution was allowed to mature for one hour, after which 50 g of water at a temperature below 20° C. was added to quench the reaction. To this solution, 150 g of water, 10 g of 12N hydrochloric acid, and 200 g of diethyl ether were further added. The water layer was separated and washed with 100 g of diethyl ether, yielding an aqueous solution of 10-phenylphenoxathiinium chloride. Sodium iodide was added to the solution for crystallization of a sulfonium salt. Crystals were filtered and dried, obtaining the target compound.

Synthesis Example 1-3

Synthesis of Triphenylsulfonium Chloride

Diphenyl sulfoxide, 40 g (0.2 mole), was dissolved in 400 g of dichloromethane, which was stirred under ice cooling. At a temperature below 20° C., 65 g (0.6 mole) of trimethylsilyl chloride was added dropwise to the solution, which was allowed to mature for 30 minutes at the temperature. Then, a Grignard reagent which had been prepared from 14.6 g (0.6 mole) of metallic magnesium, 67.5 g (0.6 mole) of chlorobenzene and 168 g of THF was added dropwise at a temperature below 20° C. The reaction solution was allowed to mature for one hour, after which 50 g of water at a temperature below 20° C. was added to quench the reaction. To this solution, 150 g of water, 10 g of 12N hydrochloric acid, and 200 g of diethyl ether were further added. The water layer was separated and washed with 100 g of diethyl ether, yielding an aqueous solution of triphenylsulfonium chloride. The compound in aqueous solution form was used in the subsequent reaction without further isolation.

Synthesis Example 1-4

Synthesis of 10-phenylphenoxathiinium 4-vinylbenzene-1-sulfonate (PM-1)

In 300 g of methanol was dissolved 39.8 g (0.098 mole) of 10-phenylphenoxathiinium iodide synthesized in Synthesis Example 1-2. 13.1 g (0.049 mole) of lead carbonate and 22.7 g (0.11 mole) of sodium 4-styrenesulfonate hydrate were added to the solution, which was heated at 70° C. The solution was allowed to cool down, after which the precipitate was filtered, and the solvent layer was distilled under reduced pressure. The residue was combined with 500 g of dichloromethane and washed with 100 g of water, after which the solvent layer was again distilled under reduced pressure. Diisopropyl ether was added to the residue for crystallization. The crystals were filtered and dried, obtaining 34 g (yield 75%) of the target compound which was identified by NMR spectroscopy.

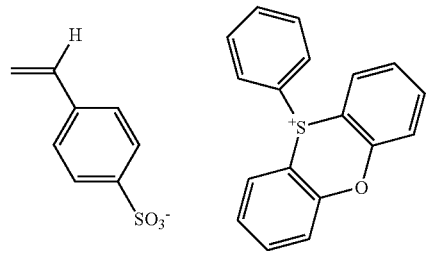

Synthesis Example 1-5

Synthesis of 10-phenylphenoxathiinium Methacrylic Acid-(4-phenyl-1-sulfonate) (PM-2)

In a mixture of 20 g of THF and 17 g of water was dissolved 3.92 g (0.020 mole) of sodium 4-hydroxybenzene-sulfonate. 4.63 g (0.030 mole) of dry methacrylic acid and 3.2 g (0.020 mole) of a 25% sodium hydroxide aqueous solution were added to the solution, which was stirred for 2 hours at room temperature. Then, 47.9 g (0.020 mole) of a 9.9% 10-phenylphenoxathiinium chloride aqueous solution and 100 g of dichloromethane were added to the solution, followed by 5 minutes of stirring. The organic layer was taken out, and washed with 50 g of water and then with 50 g of saturated sodium bicarbonate aqueous solution, after which the solvent was distilled off. To the residue was added 50 g of methyl isobutyl ketone, followed by azeotroping off residual water. The resultant white solids were washed with diisopropyl ether and dried, obtaining 7.8 g (yield 75%) of the target compound.

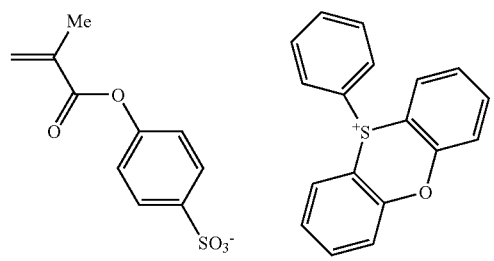

Synthesis Example 1-6

Synthesis of 10-phenylphenoxathiinium Methacrylic Acid-(6-naphthyl-2-sulfonate) (PM-3)

In a mixture of 20 g of THF and 17 g of water was dissolved 4.92 g (0.020 mole) of sodium 2-hydroxy-6-naphthalene-sulfonate. 4.63 g (0.030 mole) of dry methacrylic acid and 3.2 g (0.020 mole) of a 25% sodium hydroxide aqueous solution were added to the solution, which was stirred for 2 hours at room temperature. Then, 47.9 g (0.020 mole) of a 9.9% 10-phenylphenoxathiinium chloride aqueous solution and 100 g of dichloromethane were added to the solution, followed by 5 minutes of stirring. The organic layer was taken out, and washed with 50 g of water and then with 50 g of saturated sodium bicarbonate aqueous solution, after which the solvent was distilled off. To the residue was added 50 g of methyl isobutyl ketone, followed by azeotroping off residual water. The resultant white solids were washed with diisopropyl ether and dried, obtaining 8.6 g (yield 75%) of the target compound.

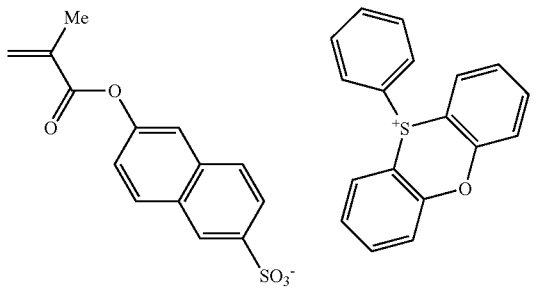

Synthesis Example 1-7

Synthesis of triphenylsulfonium 4-vinylbenzene-1-sulfonate (PM-4)

The triphenylsulfonium chloride aqueous solution (0.0167 mole) obtained in Synthesis Example 1-3 was mixed with 3.4 g (0.0167 mole) of sodium 4-vinylbenzene-1-sulfonate monohydrate and 100 g of dichloromethane. The insoluble was filtered off, after which the organic layer was taken out. The organic layer was washed 4 times with 20 g of water, and the solvent was distilled off in vacuum. Diethyl ether was added to the residue for crystallization. Amount 5.2 g, yield 70%.

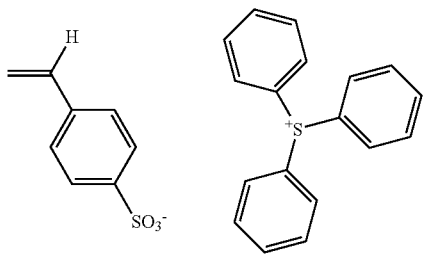

Polymer Synthesis Example

Polymers within the scope of the invention were synthesized according to the following formulation.

Synthesis Example 2-1

Synthesis of Polymer 1

In a dropping cylinder under a nitrogen blanket, 12.76 g of hydroquinone monomethacrylate, 2.91 g of acenaphthylene, 12.12 g of amyloxystyrene, 2.21 g of 10-phenylphenoxathiinium 4-vinylbenzene-1-sulfonate (PM-1), 2.93 g of dimethyl 2,2'-azobis(2-methylpropionate) (V-601 by Wako Pure Chemical Industries, Ltd.), and 87 g of propylene glycol monomethyl ether (PGME) were fed to form a monomer solution. A flask under a nitrogen blanket was charged with 33 g of PGME and heated at 80° C. with stirring, after which the monomer solution was added dropwise over 4 hours. After the completion of dropwise addition, the polymerization solution was stirred for 4 hours while keeping the temperature of 80° C. It was then cooled to room temperature. The polymerization solution was added dropwise to 1,100 g of hexane/diisopropyl ether, after which the precipitated copolymer was filtered. The copolymer was washed twice with 200 g of hexane and then dried in vacuum at 50° C. for 20 hours. The copolymer, designated Polymer 1, was obtained as white powder solids in an amount of 22.1 g and a yield of 73%.

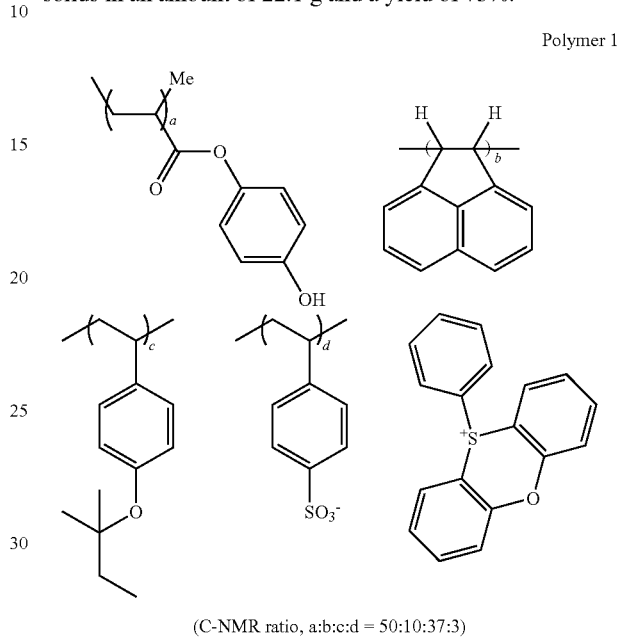

Polymer 1

(C-NMR ratio, a:b:c:d = 50:10:37:3)

Synthesis Examples 2-2 to 14, 27, 30, 31 and Comparative Synthesis Examples 9 to 12

Synthesis of Polymers 2 to 14, 27, 30, 31, and Comparative Polymers 9 to 12

Polymers shown in Table 1 were prepared by the same procedure as Synthesis Example 2-1 except that the type and proportion of monomers were changed. The structure of the units in Table 1 is shown in Tables 2 to 7. Note that the ratio of incorporated units in Table 1 is expressed in a molar ratio.

Comparative Polymer 12 was prepared by the same procedure as Synthesis Example 2-1 except that a monomer having a sulfonium structure shown below (PM-5) was used instead of monomer PM-1.

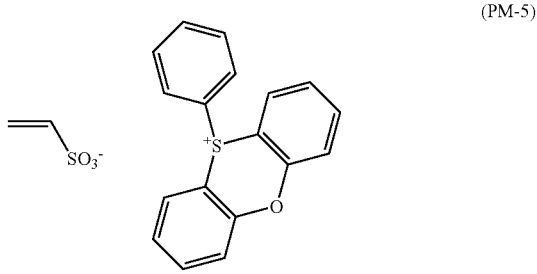

(PM-5)

Synthesis Example 2-15

Synthesis of Polymer 15

In a dropping cylinder under a nitrogen blanket, 12.64 g of hydroquinone monomethacrylate, 2.88 g of acenaphthylene, 12.01 g of amyloxystyrene, 2.46 g of 10-phenylphenoxathiinium 4-(2-methacryloyloxy)-benzene-1-sulfonate (PM-2), 2.91 g of dimethyl 2,2'-azobis(2-methylpropionate) (V-601 by Wako Pure Chemical Industries, Ltd.), and 87 g of γ-butyrolactone were fed to form a monomer solution. A flask under a nitrogen blanket was charged with 33 g of γ-butyrolactone and heated at 80° C. with stirring, after which the monomer solution was added dropwise over 4 hours. After the completion of dropwise addition, the polymerization solution was stirred for 4 hours while keeping the temperature of 80° C. It was then cooled to room temperature. The polymerization solution was added dropwise to 1,100 g of water/methanol, after which the precipitated copolymer was filtered. The copolymer was washed twice with 150 g of water/methanol and then dried in vacuum at 50° C. for 20 hours. The copolymer, designated Polymer 15, was obtained as white powder solids in an amount of 21.0 g and a yield of 70%.

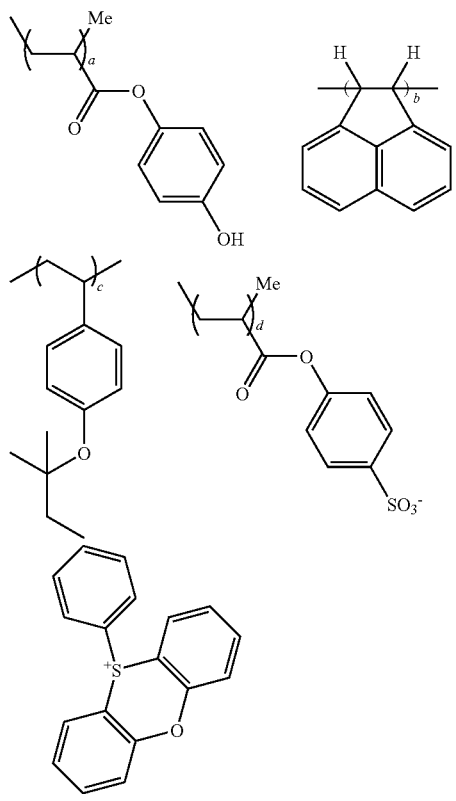

Polymer 15

(C-NMR ratio, a:b:c:d = 50:10:37:3)

Synthesis Examples 2-16 to 20, 28, 32

Synthesis of Polymers 16 to 20, 28, 32

Polymers as shown in Table 1 were prepared by the same procedure as in Synthesis Example 2-15 except that the type and proportion of monomers were changed. The structure of the units in Table 1 is shown in Tables 2 to 7. Note that the ratio of incorporated units in Table 1 is expressed in a molar ratio.

Synthesis Example 2-21

Synthesis of Polymer 21

In a dropping cylinder under a nitrogen blanket, 12.64 g of hydroquinone monomethacrylate, 2.88 g of acenaphthylene, 12.01 g of amyloxystyrene, 2.46 g of 10-phenylphenoxathiinium 6-(2-methacryloyloxy)-naphthalene-2-sulfonate (PM-3), 2.91 g of dimethyl 2,2'-azobis(2-methylpropionate) (V-601 by Wako Pure Chemical Industries, Ltd.), and 87 g of γ-butyrolactone were fed to form a monomer solution. A flask under a nitrogen blanket was charged with 33 g of γ-butyrolactone and heated at 80° C. with stirring, after which the monomer solution was added dropwise over 4 hours. After the completion of dropwise addition, the polymerization solution was stirred for 4 hours while keeping the temperature of 80° C. It was then cooled to room temperature. The polymerization solution was added dropwise to 1,100 g of water/methanol, after which the precipitated copolymer was filtered. The copolymer was washed twice with 150 g of to water/methanol and then dried in vacuum at 50° C. for 20 hours. The copolymer, designated Polymer 21, was obtained as white powder solids in an amount of 21.0 g and a yield of 70%.

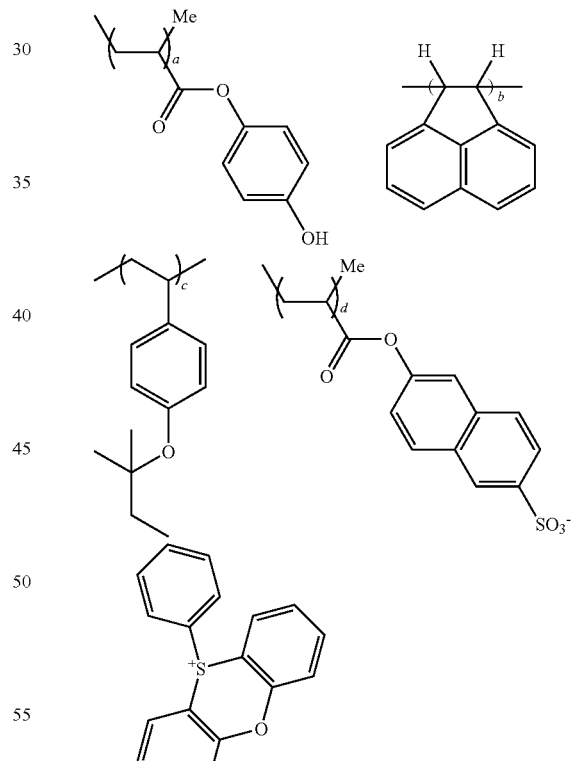

Polymer 21

(C-NMR ratio, a:b:c:d = 50:10:36:4)

Synthesis Examples 2-22 to 26, 29, 33

Synthesis of Polymers 22 to 26, 29, 33

Polymers as shown in Table 1 were prepared by the same procedure as in Synthesis Example 2-21 except that the type and proportion of monomers were changed. The structure of the units in Table 1 is shown in Tables 2 to 7. Note that the ratio of incorporated units in Table 1 is expressed in a molar ratio.

Comparative Synthesis Examples 1 to 8

Synthesis of Comparative Polymers 1 to 8

Polymerization was attempted by the same procedure as in Synthesis Example 2-1 except that the type and proportion of monomers were changed. A syrupy resin precipitated out during polymerization and was difficult to purify, failing to obtain the target compound. Reaction was effected in various solvents commonly used for polymerization. Since precipitation did not occur in dimethylformamide (DMF) during polymerization, the target compound could be obtained.

A polymer having hydroxystyrene units was obtained, for example, by first synthesizing a polymer having "C-2" structure shown in Table 4, dissolving the polymer in a solvent mixture of methanol and THF, and adding oxalic acid thereto. Deprotection reaction was allowed to run at 40° C. for 20 hours. The reaction solution was neutralized with pyridine and purified by routine re-precipitation, obtaining a polymer having hydroxystyrene units.

Polymers 11 and 13 were obtained by synthesizing a polymer having hydroxystyrene units and reacting the hydroxystyrene units with 2-methyl-1-methoxypropan-1-ene or 8-(2'-methyl-1'-propenyloxy)tricyclo[5.2.1.0$^{2,6}$]decane under oxalic acid acidic conditions.

Synthesis Example 2-34

Synthesis of Polymer 34

In a 1000-mL dropping cylinder under a nitrogen blanket, 174.77 g of 4-(1-ethoxyethoxy)styrene, 15.72 g of acenaphthylene, 9.54 g of 10-phenylphenoxathiinium 4-vinylbenzene-1-sulfonate (PM-1), 19.03 g of dimethyl 2,2'-azobis(2-methylpropionate) (V-601 by Wako Pure Chemical Industries, Ltd.), and 400 g of PGME were fed to form a monomer solution. A 2000-mL flask under a nitrogen blanket was charged with 200 g of PGME and heated at 80° C. with stirring, after which the monomer solution was added dropwise over 4 hours. After the completion of dropwise addition, the polymerization solution was continuously stirred for 20 hours while keeping the temperature of 80° C. It was then cooled to room temperature. To the polymerization solution were added 200 g of methanol and 4.00 g of oxalic acid dihydrate, followed by stirring at 50° C. for 5 hours. The solution was cooled to room temperature, to which 4 g of pyridine was added for neutralization. The reaction solution was added dropwise to 10 L of water whereupon a copolymer precipitated. The copolymer was collected by filtration and washed twice with 2 L of water. The copolymer was dissolved in 400 g of acetone. The acetone solution was again added dropwise to 10 L of water whereupon a copolymer precipitated. The copolymer was collected by filtration, washed twice with 2 L of water, and dried at 50° C. for 24 hours. There was obtained 136 g of base polymer BP having Mw=5,710 and Mw/Mn=1.47.

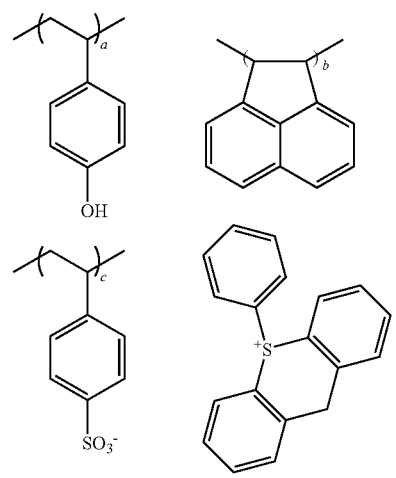

Base Polymer BP ($^1$H-NMR ratio, a:b:c = 88:10:2)

A 100-mL reactor under a nitrogen blanket was charged with 10 g of base polymer BP and 40 g of THF, which was concentrated. The concentrate was again dissolved in 30 g of THF, to which 0.6 g of methanesulfonic acid was added. In a nitrogen atmosphere at a controlled temperature of 0-5° C., 5.71 g of 8-(2'-methyl-1'-propenyloxy)tricyclo[5.2.1.0$^{2,6}$]decane was added dropwise to the solution under acidic conditions. After the completion of dropwise addition, the solution was allowed to mature for 6 hours. At the end of reaction, 0.66 g of triethylamine was added for neutralization. The reaction solution was added dropwise to 240 g of hexane whereupon a polymer precipitated. The polymer was collected by filtration, washed twice with 50 g of hexane, and dissolved in 35 g of acetic acid and 20 g of water, followed by 6 times of water washing and phase separation. The organic layer resulting from the final phase separation, that is, ethyl acetate solution was concentrated by distilling off the ethyl acetate, and dissolved in 20 g of acetone. The acetone solution was added dropwise to 400 g of water whereupon an acetal form of polymer precipitated. The acetal form of polymer was collected by filtration, washed twice with 100 g of water, and dried at 40° C. for 24 hours. There was obtained 9 g of an acetal-modified polymer designated Polymer 34, which had Mw=6,020 and Mw/Mn=1.41.

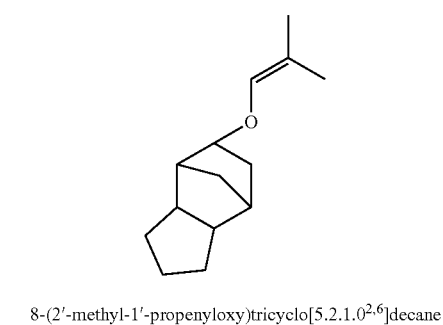

8-(2'-methyl-1'-propenyloxy)tricyclo[5.2.1.0$^{2,6}$]decane

-continued

Polymer 34

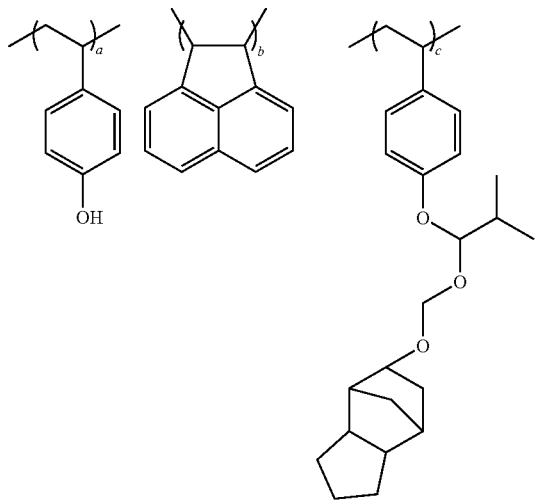
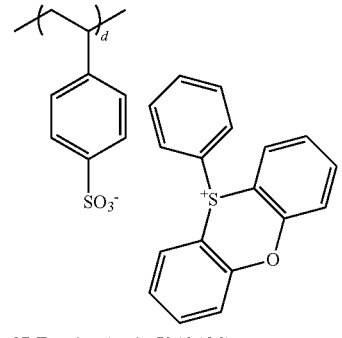

($^1$H—NMR ratio, a:b:c:d = 70:10:18:2)

With respect to deprotection and protection of polyhydroxystyrene derivatives, reference should be made to JP-A 2004-115630 and JP-A 2005-008766.

TABLE 1

| Resin | Unit 1 (incorporation ratio) | Unit 2 (incorporation ratio) | Unit 3 (incorporation ratio) | Unit 4 (incorporation ratio) | Unit 5 (incorporation ratio) |
|---|---|---|---|---|---|
| Polymer 1 | PM-1(0.03) | A-2(0.50) | B-2(0.37) | D-2(0.10) | — |
| Comparative Polymer 1 | PM-1(0.13) | A-2(0.50) | B-2(0.27) | D-2(0.10) | — |
| Polymer 2 | PM-1(0.04) | A-2(0.60) | B-2(0.36) | — | — |
| Polymer 3 | PM-1(0.03) | A-2(0.51) | B-2(0.36) | D-1(0.10) | — |
| Polymer 4 | PM-1(0.03) | A-2(0.40) | B-2(0.37) | D-2(0.10) | A-3(0.10) |
| Polymer 5 | PM-1(0.03) | A-2(0.50) | B-3(0.37) | D-2(0.10) | — |
| Comparative Polymer 2 | PM-1(0.11) | A-2(0.53) | B-3(0.26) | D-2(0.10) | — |
| Polymer 6 | PM-1(0.05) | A-2(0.52) | E-1(0.33) | D-2(0.10) | — |
| Polymer 7 | PM-1(0.04) | A-2(0.50) | E-2(0.36) | D-2(0.10) | — |
| Polymer 8 | PM-1(0.03) | A-2(0.50) | E-3(0.37) | D-2(0.10) | — |
| Comparative Polymer 3 | PM-1(0.12) | A-2(0.50) | E-3(0.27) | D-2(0.11) | — |
| Polymer 9 | PM-1(0.05) | A-2(0.50) | B-2(0.25) | D-2(0.10) | F-1(0.10) |
| Polymer 10 | PM-1(0.03) | A-2(0.50) | B-2(0.27) | D-2(0.10) | F-2(0.10) |
| Polymer 11 | PM-1(0.04) | A-1(0.50) | B-2(0.26) | D-2(0.10) | C-1(0.10) |
| Polymer 12 | PM-1(0.04) | A-2(0.50) | B-2(0.26) | D-2(0.10) | C-2(0.10) |
| Polymer 13 | PM-1(0.03) | A-1(0.50) | B-2(0.27) | D-2(0.10) | C-3(0.10) |
| Polymer 14 | PM-1(0.04) | A-2(0.50) | B-2(0.26) | D-2(0.10) | B-1(0.10) |
| Polymer 15 | PM-2(0.03) | A-2(0.50) | B-2(0.37) | D-2(0.10) | — |
| Polymer 16 | PM-2(0.03) | A-2(0.51) | B-2(0.36) | D-1(0.10) | — |
| Comparative Polymer 4 | PM-2(0.11) | A-2(0.51) | B-2(0.28) | D-2(0.10) | — |
| Polymer 17 | PM-2(0.03) | A-2(0.50) | B-3(0.37) | D-2(0.10) | — |
| Polymer 18 | PM-2(0.04) | A-2(0.52) | E-1(0.34) | D-2(0.10) | — |
| Polymer 19 | PM-2(0.04) | A-2(0.50) | E-2(0.36) | D-2(0.10) | — |
| Polymer 20 | PM-2(0.03) | A-2(0.50) | E-3(0.37) | D-2(0.10) | — |
| Polymer 21 | PM-3(0.04) | A-2(0.50) | B-2(0.36) | D-2(0.10) | — |
| Comparative Polymer 5 | PM-3(0.12) | A-2(0.50) | B-2(0.28) | D-2(0.10) | — |
| Polymer 22 | PM-3(0.05) | A-2(0.52) | E-1(0.33) | D-2(0.10) | — |
| Polymer 23 | PM-3(0.03) | A-2(0.50) | B-3(0.37) | D-2(0.10) | — |
| Polymer 24 | PM-3(0.03) | A-2(0.50) | B-2(0.27) | D-2(0.10) | F-3(0.10) |
| Polymer 25 | PM-3(0.03) | A-2(0.50) | B-2(0.27) | D-2(0.10) | F-4(0.10) |
| Comparative Polymer 6 | PM-3(0.13) | A-2(0.40) | B-2(0.27) | D-2(0.10) | F-4(0.10) |
| Polymer 26 | PM-3(0.03) | A-2(0.50) | B-2(0.27) | D-2(0.10) | F-5(0.10) |
| Polymer 27 | PM-1(0.03) | A-1(0.51) | B-2(0.35) | D-2(0.11) | — |
| Comparative Polymer 7 | PM-1(0.11) | A-1(0.51) | B-2(0.27) | D-2(0.11) | — |
| Polymer 28 | PM-2(0.03) | A-1(0.50) | B-2(0.37) | D-2(0.10) | — |
| Polymer 29 | PM-3(0.03) | A-1(0.51) | B-2(0.36) | D-2(0.10) | — |
| Polymer 30 | PM-1(0.03) | A-3(0.51) | B-2(0.35) | D-2(0.11) | — |
| Polymer 31 | PM-1(0.03) | A-4(0.51) | B-2(0.35) | D-2(0.11) | — |
| Comparative Polymer 8 | PM-1(0.13) | A-4(0.51) | B-2(0.25) | D-2(0.11) | — |
| Polymer 32 | PM-2(0.03) | A-4(0.50) | B-2(0.37) | D-2(0.10) | — |
| Polymer 33 | PM-3(0.03) | A-4(0.51) | B-2(0.36) | D-2(0.10) | — |
| Comparative Polymer 9 | PM-4(0.03) | A-2(0.50) | B-2(0.37) | D-2(0.10) | — |
| Comparative Polymer 10 | PM-4(0.03) | A-2(0.50) | B-3(0.37) | D-2(0.10) | — |
| Comparative Polymer 11 | PM-4(0.03) | A-2(0.50) | E-3(0.37) | D-2(0.10) | — |

TABLE 1-continued
| Resin | Unit 1 (incorporation ratio) | Unit 2 (incorporation ratio) | Unit 3 (incorporation ratio) | Unit 4 (incorporation ratio) | Unit 5 (incorporation ratio) |
|---|---|---|---|---|---|
| Comparative Polymer 12 | PM-5(0.03) | A-2(0.51) | B-2(0.36) | D-2(0.10) | — |
| Polymer 34 | PM-1(0.02) | A-1(0.70) | — | D-2(0.10) | C-3(0.18) |
TABLE 2
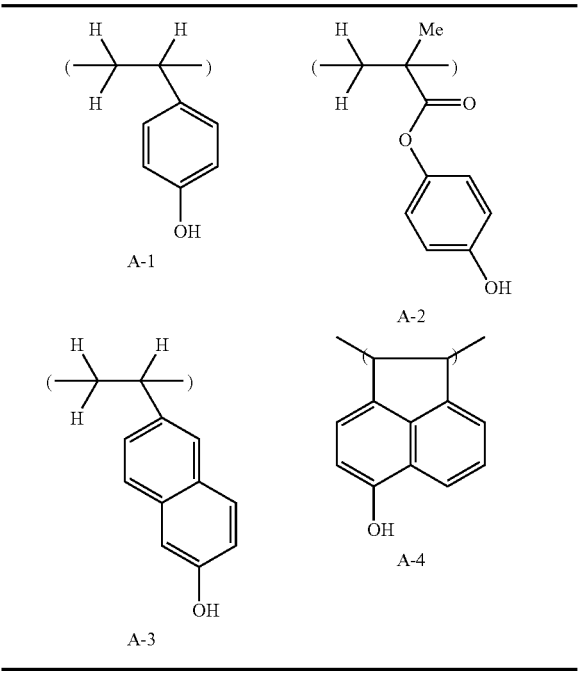
TABLE 3
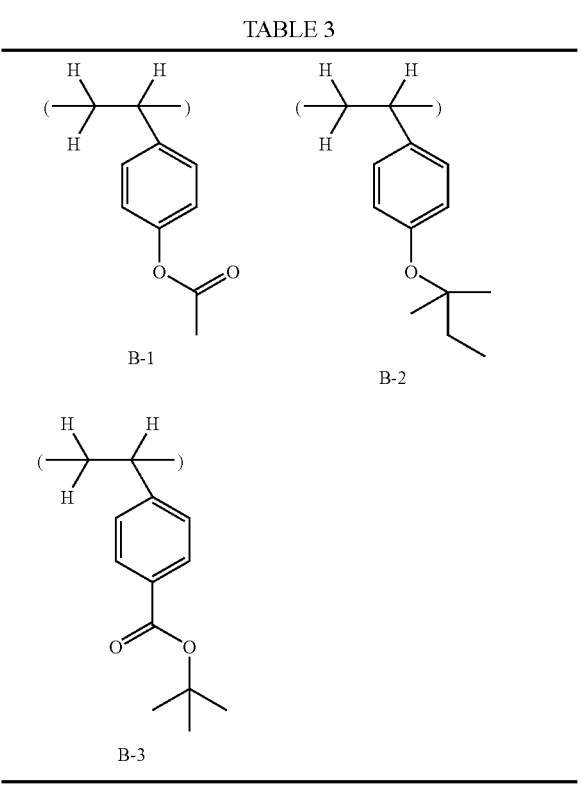
TABLE 4
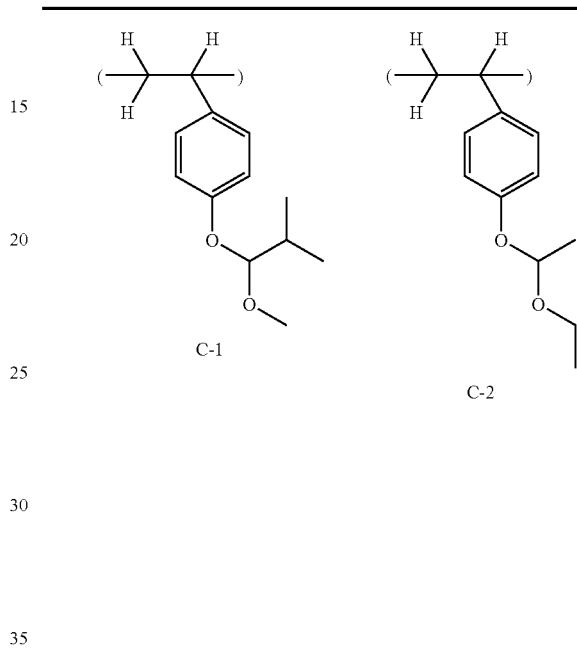
TABLE 5
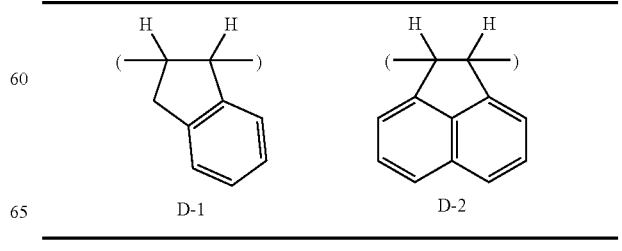

TABLE 6

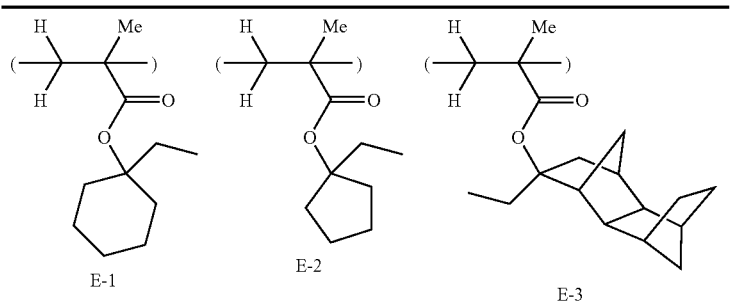

TABLE 7

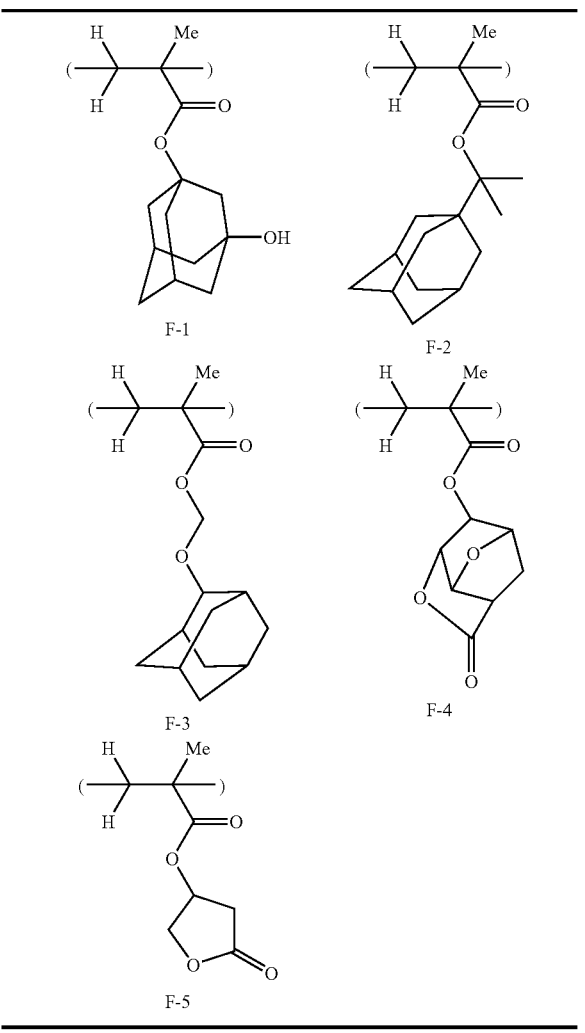

Examples and Comparative Examples

Preparation of Positive Resist Compositions

Positive resist compositions in solution form were prepared by dissolving the polymers synthesized above (Polymers 1 to 34 or Comparative Polymers 1 to 12), an optional acid generator (PAG-1), and a basic compound (Base-1) in a solvent mixture (Solvents 1, 2 and 3) in accordance with the recipe shown in Table 8. These compositions were each filtered through a filter having a pore size of 0.2 μm or 0.02 μm. Note that 0.075 part by weight of surfactant PF-636 (Omnova Solutions) was added to each composition.

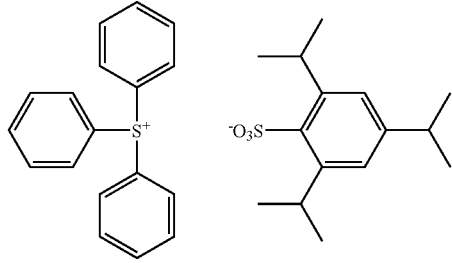

PAG-1

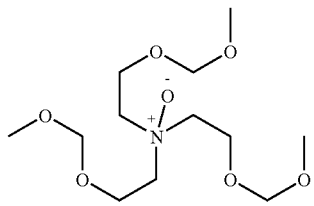

Base-1

In Table 8, Solvents 1, 2 and 3 are propylene glycol monomethyl ether acetate (PGMEA), ethyl lactate (EL), and propylene glycol monomethyl ether (PGME), respectively.

TABLE 8

|  | Resin (pbw) | Acid generator (pbw) | Base (pbw) | Solvent 1 (pbw) | Solvent 2 (pbw) | Solvent 3 (pbw) |
| --- | --- | --- | --- | --- | --- | --- |
| Example 1 | Polymer 1(80) | — | Base-1(0.2) | PGMEA(1,000) | EL(1,000) | PGME(1,300) |
| Comparative Example 1 | Comparative Polymer 1(80) | — | Base-1(0.2) | PGMEA(1,000) | EL(1,000) | PGME(1,300) |
| Example 2 | Polymer 1(80) | PAG-1(2) | Base-1(0.2) | PGMEA(1,000) | EL(1,000) | PGME(1,300) |
| Example 3 | Polymer 2(80) | — | Base-1(0.2) | PGMEA(1,000) | EL(1,000) | PGME(1,300) |
| Example 4 | Polymer 3(80) | — | Base-1(0.2) | PGMEA(1,000) | EL(1,000) | PGME(1,300) |

TABLE 8-continued

| | Resin (pbw) | Acid generator (pbw) | Base (pbw) | Solvent 1 (pbw) | Solvent 2 (pbw) | Solvent 3 (pbw) |
|---|---|---|---|---|---|---|
| Example 5 | Polymer 4(80) | — | Base-1(0.2) | PGMEA(1,000) | EL(1,000) | PGME(1,300) |
| Example 6 | Polymer 5(80) | — | Base-1(0.2) | PGMEA(1,000) | EL(1,000) | PGME(1,300) |
| Comparative Example 2 | Comparative Polymer 2(80) | — | Base-1(0.2) | PGMEA(1,000) | EL(1,000) | PGME(1,300) |
| Example 7 | Polymer 6(80) | — | Base-1(0.2) | PGMEA(1,000) | EL(1,000) | PGME(1,300) |
| Example 8 | Polymer 7(80) | — | Base-1(0.2) | PGMEA(1,000) | EL(1,000) | PGME(1,300) |
| Example 9 | Polymer 8(80) | — | Base-1(0.2) | PGMEA(1,000) | EL(1,000) | PGME(1,300) |
| Comparative Example 3 | Comparative Polymer 3(80) | — | Base-1(0.2) | PGMEA(1,000) | EL(1,000) | PGME(1,300) |
| Example 10 | Polymer 9(80) | — | Base-1(0.2) | PGMEA(1,000) | EL(1,000) | PGME(1,300) |
| Example 11 | Polymer 10(80) | — | Base-1(0.2) | PGMEA(1,000) | EL(1,000) | PGME(1,300) |
| Example 12 | Polymer 11(80) | — | Base-1(0.2) | PGMEA(1,000) | EL(1,000) | PGME(1,300) |
| Example 13 | Polymer 12(80) | — | Base-1(0.2) | PGMEA(1,000) | EL(1,000) | PGME(1,300) |
| Example 14 | Polymer 13(80) | — | Base-1(0.2) | PGMEA(1,000) | EL(1,000) | PGME(1,300) |
| Example 15 | Polymer 14(80) | — | Base-1(0.2) | PGMEA(1,000) | EL(1,000) | PGME(1,300) |
| Example 16 | Polymer 15(80) | — | Base-1(0.2) | PGMEA(1,000) | EL(1,000) | PGME(1,300) |
| Example 17 | Polymer 16(80) | — | Base-1(0.2) | PGMEA(1,000) | EL(1,000) | PGME(1,300) |
| Comparative Example 4 | Comparative Polymer 4(80) | — | Base-1(0.2) | PGMEA(1,000) | EL(1,000) | PGME(1,300) |
| Example 18 | Polymer 17(80) | — | Base-1(0.2) | PGMEA(1,000) | EL(1,000) | PGME(1,300) |
| Example 19 | Polymer 18(80) | — | Base-1(0.2) | PGMEA(1,000) | EL(1,000) | PGME(1,300) |
| Example 20 | Polymer 19(80) | — | Base-1(0.2) | PGMEA(1,000) | EL(1,000) | PGME(1,300) |
| Example 21 | Polymer 20(80) | — | Base-1(0.2) | PGMEA(1,000) | EL(1,000) | PGME(1,300) |
| Example 22 | Polymer 21(80) | — | Base-1(0.2) | PGMEA(1,000) | EL(1,000) | PGME(1,300) |
| Comparative Example 5 | Comparative Polymer 5(80) | — | Base-1(0.2) | PGMEA(1,000) | EL(1,000) | PGME(1,300) |
| Example 23 | Polymer 22(80) | — | Base-1(0.2) | PGMEA(1,000) | EL(1,000) | PGME(1,300) |
| Example 24 | Polymer 23(80) | — | Base-1(0.2) | PGMEA(1,000) | EL(1,000) | PGME(1,300) |
| Example 25 | Polymer 24(80) | — | Base-1(0.2) | PGMEA(1,000) | EL(1,000) | PGME(1,300) |
| Example 26 | Polymer 25(80) | — | Base-1(0.2) | PGMEA(1,000) | EL(1,000) | PGME(1,300) |
| Comparative Example 6 | Comparative Polymer 6(80) | — | Base-1(0.2) | PGMEA(1,000) | EL(1,000) | PGME(1,300) |
| Example 27 | Polymer 26(80) | — | Base-1(0.2) | PGMEA(1,000) | EL(1,000) | PGME(1,300) |
| Example 28 | Polymer 27(80) | — | Base-1(0.2) | PGMEA(1,000) | EL(1,000) | PGME(1,300) |
| Comparative Example 7 | Comparative Polymer 7(80) | — | Base-1(0.2) | PGMEA(1,000) | EL(1,000) | PGME(1,300) |
| Example 29 | Polymer 28(80) | — | Base-1(0.2) | PGMEA(1,000) | EL(1,000) | PGME(1,300) |
| Example 30 | Polymer 29(80) | — | Base-1(0.2) | PGMEA(1,000) | EL(1,000) | PGME(1,300) |
| Example 31 | Polymer 30(80) | — | Base-1(0.2) | PGMEA(1,000) | EL(1,000) | PGME(1,300) |
| Example 32 | Polymer 31(80) | — | Base-1(0.2) | PGMEA(1,000) | EL(1,000) | PGME(1,300) |
| Comparative Example 8 | Comparative Polymer 8(80) | — | Base-1(0.2) | PGMEA(1,000) | EL(1,000) | PGME(1,300) |
| Example 33 | Polymer 32(80) | — | Base-1(0.2) | PGMEA(1,000) | EL(1,000) | PGME(1,300) |
| Example 34 | Polymer 33(80) | — | Base-1(0.2) | PGMEA(1,000) | EL(1,000) | PGME(1,300) |
| Comparative Example 9 | Comparative Polymer 9(80) | — | Base-1(0.2) | PGMEA(1,000) | EL(1,000) | PGME(1,300) |
| Comparative Example 10 | Comparative Polymer 10(80) | — | Base-1(0.2) | PGMEA(1,000) | EL(1,000) | PGME(1,300) |
| Comparative Example 11 | Comparative Polymer 11(80) | — | Base-1(0.2) | PGMEA(1,000) | EL(1,000) | PGME(1,300) |
| Comparative Example 12 | Comparative Polymer 12(80) | — | Base-1(0.2) | PGMEA(1,000) | EL(1,000) | PGME(1,300) |
| Example 35 | Polymer 34(80) | — | Base-1(0.2) | PGMEA(1,000) | EL(1,000) | PGME(1,300) |

EB Image Writing Test

Using a coater/developer system Clean Track ACT M (Tokyo Electron Ltd.), each of the positive resist compositions (Examples 1 to 35, Comparative Examples 1 to 12) was spin coated on a mask blank of 152 mm square having a chromium oxynitride film as the outermost surface and pre-baked on a hot plate at 110° C. for 600 seconds to form a resist film of 60 nm thick. The thickness of a resist film was measured by an optical thin film measurement system NanoSpec (Nanometrics Inc.). Measurement was made at 81 points within the surface region of the blank substrate excluding an outer region extending 10 mm inward from the periphery of the blank, from which an average film thickness and a film thickness range were determined.

The wafer was exposed by means of an EB lithography system EBM-5000plus (NuFlare Technology Inc.) at an accelerating voltage of 50 keV, post-exposure baked (PEB) at 110° C. for 600 seconds, and developed in a 2.38 wt % tetramethylammonium hydroxide aqueous solution to form a positive resist pattern.

The resist pattern was evaluated as follows. The pattern-bearing wafer was observed under a top-down scanning electron microscope (TD-SEM). The optimum exposure was defined as the exposure dose (μC/cm$^2$) which provided a 1:1 resolution at the top and bottom of a 200-nm 1:1 line-and-space pattern. The maximum resolution of the resist was defined as the minimum line width of a L/S pattern that was resolved and separated at the optimum exposure. The line edge roughness (LER) of a 100-nm L/S pattern was evaluated under SEM. The pattern was visually observed to judge whether or not the profile was rectangular.

The test results of inventive and comparative resist compositions by EB lithography are shown in Table 9.

TABLE 9

| | Optimum exposure (μC/cm²) | Maximum resolution (nm) | LER (nm) | Pattern profile |
|---|---|---|---|---|
| Example 1 | 26 | 35 | 4.2 | rectangular |
| Comparative Example 1 | not dissolved in solvent, failed in resist preparation | | | |
| Example 2 | 23 | 35 | 4.4 | rectangular |
| Example 3 | 26 | 50 | 4.3 | rectangular |
| Example 4 | 27 | 40 | 4.4 | rectangular |
| Example 5 | 27 | 35 | 4.4 | rectangular |
| Example 6 | 27 | 40 | 4.2 | rectangular |
| Comparative Example 2 | not dissolved in solvent, failed in resist preparation | | | |
| Example 7 | 23 | 35 | 4.6 | rectangular |
| Example 8 | 24 | 40 | 4.9 | rectangular |
| Example 9 | 24 | 35 | 4.8 | rectangular |
| Comparative Example 3 | not dissolved in solvent, failed in resist preparation | | | |
| Example 10 | 26 | 35 | 4.7 | rectangular |
| Example 11 | 27 | 40 | 4.7 | rectangular |
| Example 12 | 23 | 35 | 4.3 | rectangular |
| Example 13 | 24 | 35 | 4.8 | rectangular |
| Example 14 | 24 | 40 | 4.6 | rectangular |
| Example 15 | 26 | 35 | 4.4 | rectangular |
| Example 16 | 26 | 35 | 4.2 | rectangular |
| Example 17 | 26 | 40 | 4.2 | rectangular |
| Comparative Example 4 | not dissolved in solvent, failed in resist preparation | | | |
| Example 18 | 27 | 35 | 4.3 | rectangular |
| Example 19 | 24 | 40 | 4.2 | rectangular |
| Example 20 | 24 | 35 | 4.1 | rectangular |
| Example 21 | 24 | 40 | 4.3 | rectangular |
| Example 22 | 26 | 35 | 4.5 | rectangular |
| Comparative Example 5 | not dissolved in solvent, failed in resist preparation | | | |
| Example 23 | 24 | 35 | 4.1 | rectangular |
| Example 24 | 28 | 35 | 4.3 | rectangular |
| Example 25 | 27 | 35 | 4.1 | rectangular |
| Example 26 | 28 | 35 | 4.5 | rectangular |
| Comparative Example 6 | not dissolved in solvent, failed in resist preparation | | | |
| Example 27 | 27 | 35 | 4.4 | rectangular |
| Example 28 | 27 | 35 | 4.4 | rectangular |
| Comparative Example 7 | not dissolved in solvent, failed in resist preparation | | | |
| Example 29 | 28 | 35 | 4.3 | rectangular |
| Example 30 | 27 | 35 | 4.3 | rectangular |
| Example 31 | 28 | 35 | 4.5 | rectangular |
| Example 32 | 26 | 30 | 4.6 | rectangular |
| Comparative Example 8 | not dissolved in solvent, failed in resist preparation | | | |
| Example 33 | 27 | 35 | 4.4 | rectangular |
| Example 34 | 26 | 35 | 4.2 | rectangular |
| Comparative Example 9 | 29 | 60 | 6.0 | rounded top + footing |
| Comparative Example 10 | 29 | 60 | 6.1 | rounded top + footing |
| Comparative Example 11 | 27 | 60 | 6.0 | rounded top + footing |
| Comparative Example 12 | 28 | 50 | 5.5 | rectangular |
| Example 35 | 24 | 35 | 4.3 | rectangular |

Dry Etching Test

In a dry etching test, the resist solution prepared as in Table 8 was applied onto a Cr film of 46 nm thick by spin coating to form a resist film of 100 nm thick. Using UNAXIS generation 4, an etching test was performed on the coated film. For evaluation, a selectivity ratio was determined as (thickness loss of Cr film)/(thickness loss of resist film) after the etching test. A higher selectivity ratio indicates better etch resistance.

The etching test was under the following $Cl_2/O_2$ gas etching conditions.

| | |
|---|---|
| Chamber pressure | 5.5 mT |
| Inductively coupled plasma | 350 W |
| Reactive ion etching | 690 V |
| $Cl_2$ gas flow rate | 150 ml/min |
| $O_2$ gas flow rate | 50 ml/min |
| He gas flow rate | 10 ml/min |
| Over-etching | 65% |
| Time | 180 sec |

TABLE 10

| Polymer | Etching selectivity |
|---|---|
| Polymer 1 | 1.28 |
| Polymer 15 | 1.21 |
| Polymer 21 | 1.25 |
| Comparative Polymer 12 | 1.02 |

It has been demonstrated that the polymers within the scope of the invention do not precipitate out during polymerization reaction and eliminate difficult solubility in resist solvents. It is seen from Tables 9 and 10 that the resist compositions of the invention exhibit excellent resolution, rectangular profile and reduced values of LER, as compared with comparative resist compositions (Comparative Examples 9 to 11). A comparison of Examples 1 and 3 reveals that Example 3 exhibits slightly lower resolution, indicating that a higher contrast is achievable by copolymerizing indene or acenaphthylene units. Also etching selectivity is improved by utilizing the specific structure disclosed herein. It has been demonstrated that the chemically amplified positive photoresist composition is advantageously used as a fine size pattern or mask pattern-forming material by the EB lithography for the fabrication of VLSI devices.

Japanese Patent Application No. 2009-142909 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive photoresist composition comprising a polymer comprising recurring units having the general formulae (1) to (3) or (1) to (4):

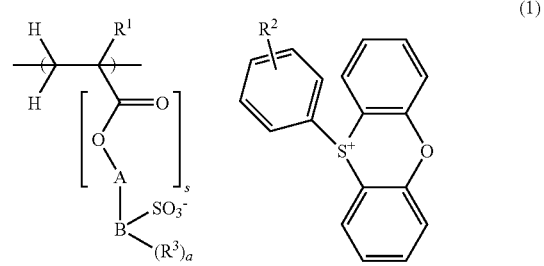

-continued

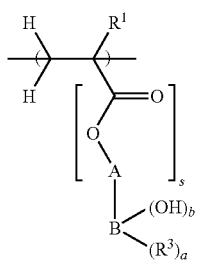  (2)

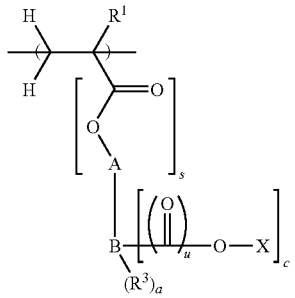  (3)

—(Q)—  (4)

wherein R¹ is hydrogen, fluorine, methyl or trifluoromethyl, R² is hydrogen, a substituted or unsubstituted, straight, branched or cyclic $C_1$-$C_{10}$ alkyl group, or a substituted or unsubstituted, straight, branched or cyclic $C_1$-$C_{10}$ alkoxy group, R³ is each independently a $C_1$-$C_{10}$ alkyl group, A is a single bond or a divalent $C_1$-$C_{10}$ organic group which may be separated by an ether bond, B is a benzene ring or fused polycyclic aromatic group comprising up to 3 aromatic rings, s is each independently 0 or 1, u is 0 or 1, a is each independently an integer of 0 to 3, b and c are each independently an integer of 1 to 3, X is an acid labile group when c is 1, X is hydrogen or an acid labile group when c is 2 or 3, at least one X is an acid labile group, and Q has the general formula (5) or (6):

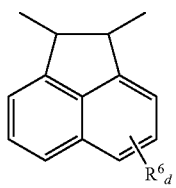  (5)

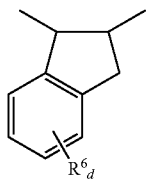  (6)

wherein R⁶ is each independently hydrogen, hydroxyl, $C_1$-$C_7$ alkylcarbonyloxy or $C_1$-$C_6$ alkyl, alkoxy, haloalkyl or haloalkoxy group, and d is an integer of 0 to 4, the units of formula (1) accounting for up to 10 mol % based on the entire units of the polymer.

2. The photoresist composition of claim 1 wherein in formula (1), the structure represented by the following formula:

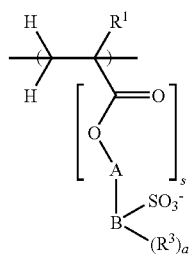

is selected from structures having the following formulae:

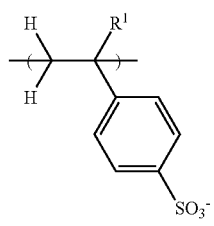 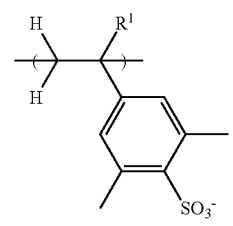

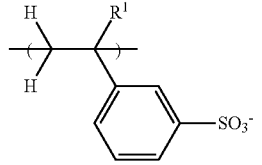

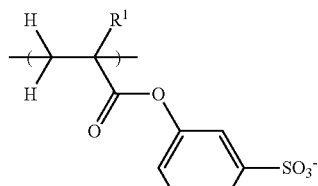

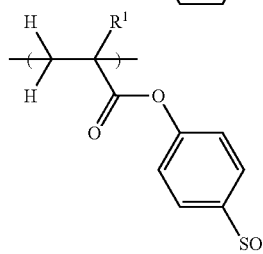

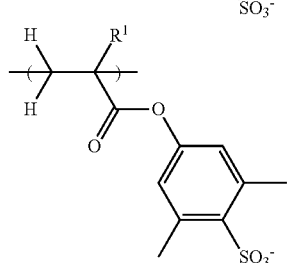

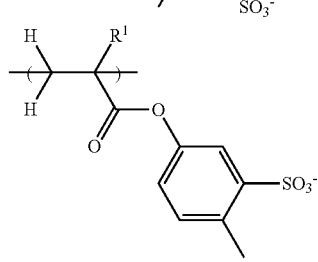

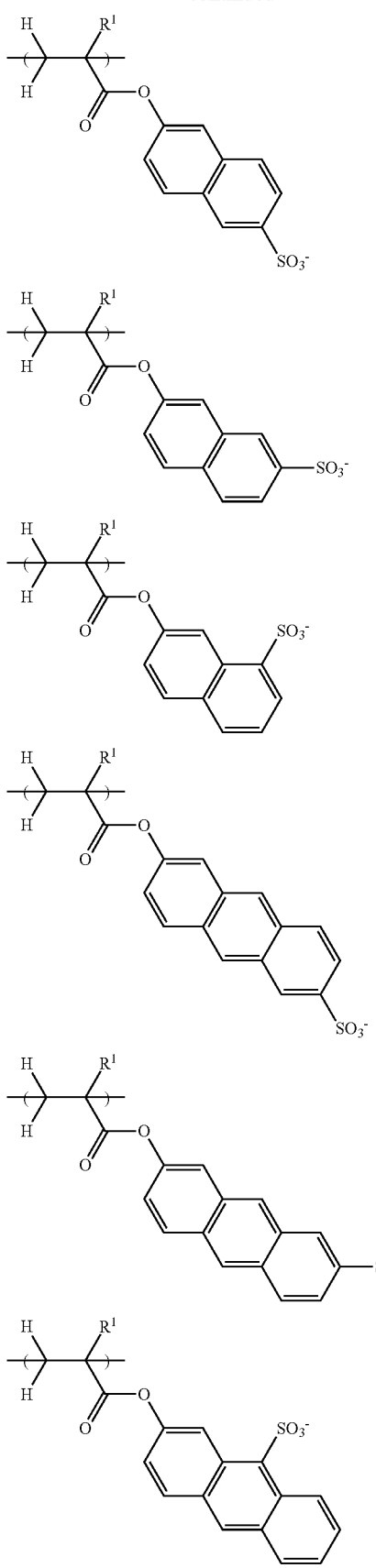
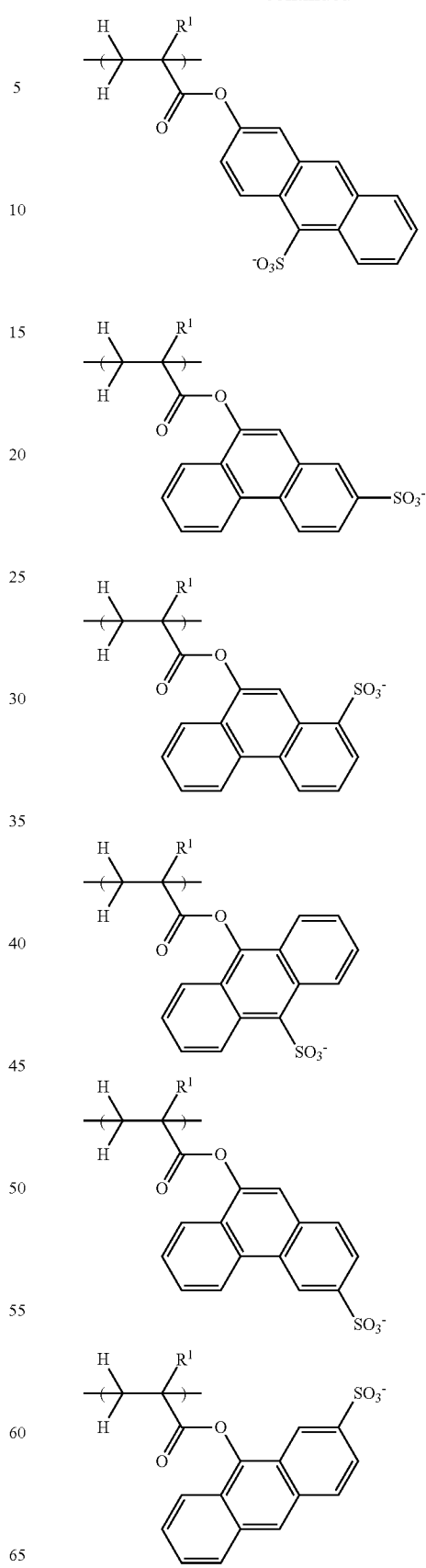

-continued
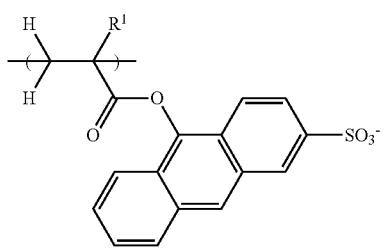
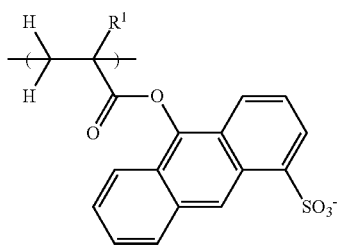
wherein R¹ is as defined above.
3. The photoresist composition of claim 1 wherein the unit of formula (2) is selected from the following formulae:
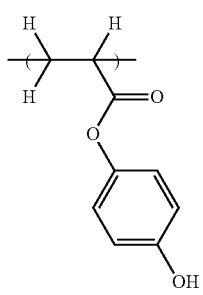
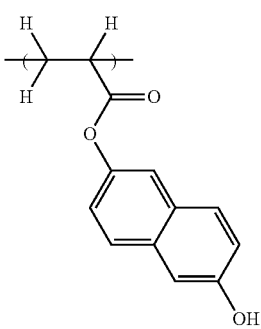
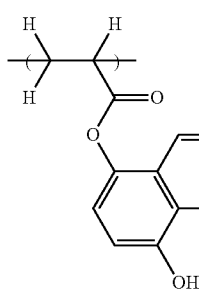
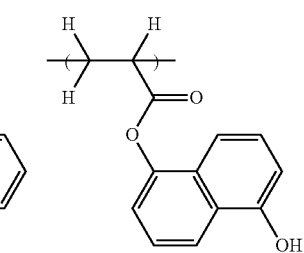
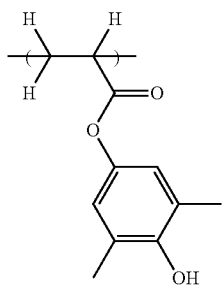
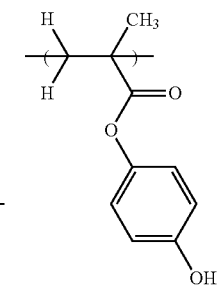
-continued
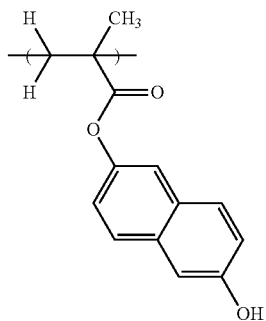
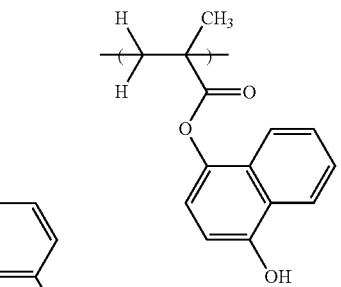
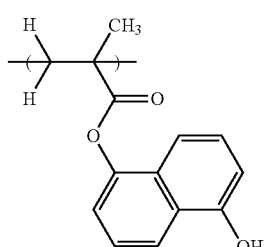
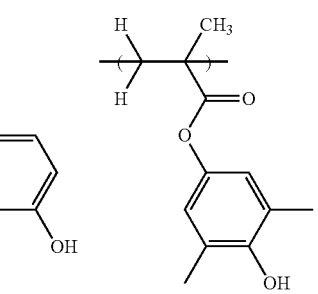
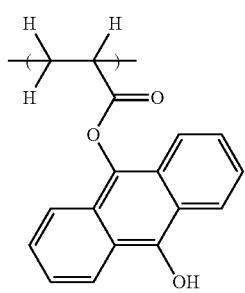
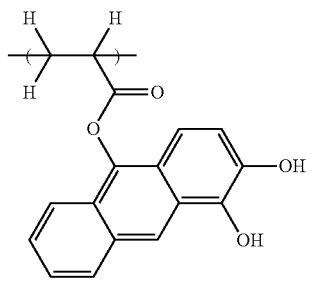

-continued

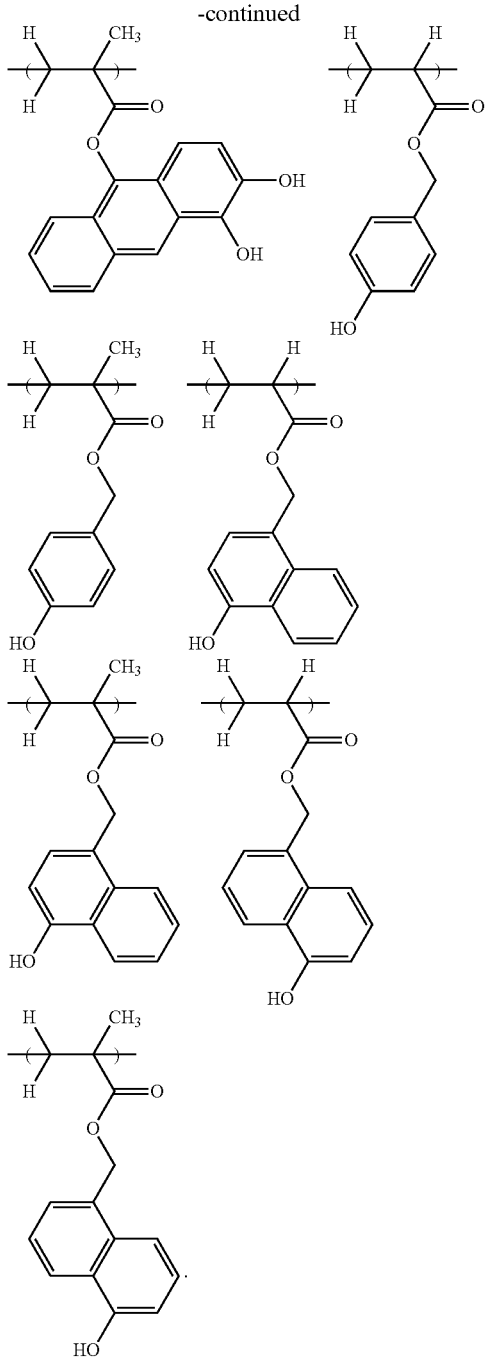

4. The photoresist composition of claim 1 wherein the unit of formula (2) is a unit derived from a monomer selected from the group consisting of 3-hydroxystyrene, 4-hydroxystyrene, 5-hydroxy-2-vinylnaphthalene, 6-hydroxy-2-vinylnaphthalene, and 7-hydroxy-2-vinylnaphthalene.

5. The photoresist composition of claim 1 wherein the acid labile group is a $C_4$-$C_{18}$ tertiary alkyl group or an acetal group of the following formula (7):

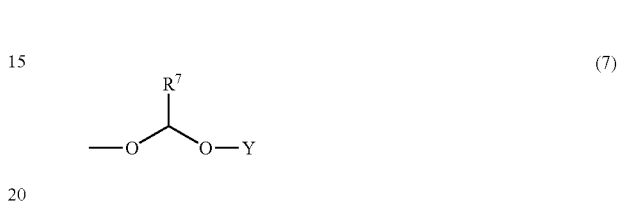

(7)

wherein $R^7$ is hydrogen or a straight, branched or cyclic $C_1$-$C_{10}$ alkyl group, and Y is a straight, branched, cyclic or polycyclic $C_1$-$C_{30}$ alkyl group.

6. A process for forming a resist pattern, comprising the steps of applying the chemically amplified photoresist composition of claim 1 onto a processable substrate to form a resist film, exposing the resist film to a pattern of high-energy radiation, and developing the exposed resist film with an alkaline developer to form a resist pattern.

7. The process of claim 6 wherein the high-energy radiation is EUV or electron beam.

8. The process of claim 6 wherein the processable substrate comprises an outermost surface layer of chromium-containing material.

9. The photoresist composition of claim 1, wherein the polymer comprises the recurring units of formula (1) in a proportion of 1 to 5 mol %.

10. The photoresist composition of claim 1, wherein the total amount of units of formulae (1) to (3) where units of formula (4) are not incorporated, or the total amount of units of formulae (1) to (4) where units of formula (4) are incorporated, accounts for at least 85 mol %.

* * * * *